(12) United States Patent
Takahashi et al.

(10) Patent No.: US 6,465,839 B2
(45) Date of Patent: Oct. 15, 2002

(54) SEMICONDUCTOR DEVICE HAVING LATERAL MOSFET (LDMOS)

(75) Inventors: Shigeki Takahashi, Okazaki (JP); Hiroaki Himi, Nagoya (JP); Satoshi Shiraki, Toyohashi (JP); Masatoshi Kato, Aichi-gun (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/827,329

(22) Filed: Apr. 6, 2001

(65) Prior Publication Data

US 2002/0005550 A1 Jan. 17, 2002

(30) Foreign Application Priority Data

Apr. 7, 2000 (JP) ........................... 2000-106991
Dec. 27, 2000 (JP) ........................... 2000-298749

(51) Int. Cl.$^7$ ............................................ H01L 29/788
(52) U.S. Cl. ..................................... 257/316; 257/315
(58) Field of Search ................................ 257/339–387, 257/315, 316, 337, 338, 298, 492; 438/197, 514, 592, 589, 620, 259

(56) References Cited

U.S. PATENT DOCUMENTS

| 4,922,327 A | * | 5/1990 | Mena et al. ................ 357/23.4 |
| 5,355,003 A |   | 10/1994 | Tomomatsu |
| 5,357,135 A |   | 10/1994 | Aronowitz et al. |
| 5,548,150 A | * | 8/1996 | Omura et al. ................ 257/349 |
| 5,780,905 A |   | 7/1998 | Chen et al. |
| 5,932,897 A |   | 8/1999 | Kawaguchi et al. |

FOREIGN PATENT DOCUMENTS

| EP | 0308612 A2 | 3/1989 |
| EP | 0880183 A2 | 11/1998 |
| JP | 59-132671 | 7/1984 |
| JP | 64-82563 | 3/1989 |
| JP | 2656740 | 5/1996 |
| JP | 9-205201 | 8/1997 |
| JP | 10-27905 | 1/1998 |
| JP | 10-189956 | 7/1998 |
| JP | 10-313064 | 11/1998 |
| JP | 11-40808 | 2/1999 |

* cited by examiner

Primary Examiner—David Nelms
Assistant Examiner—Long K. Tran
(74) Attorney, Agent, or Firm—Law Offices of David G. Posz

(57) ABSTRACT

In an LDMOS, an n-type region 6, which is formed to have a concentration higher than that of an n-type substrate 1 and whose concentration gradually increases from the n-type substrate 1 to an n$^+$ type drain region 5, is disposed so as to surround the n$^+$-type drain region 5. Further, a p$^+$-type contact region 9 disposed adjacent to an n$^+$-type source region 8 is formed so as to extend below the n$^+$-type source region 8 so that a parasitic transistor formed by the n$^+$-type source region 8, a p-type base region 7 and the n-type substrate 1 is hardly turned ON.

16 Claims, 21 Drawing Sheets

Id=200A

Id=20A

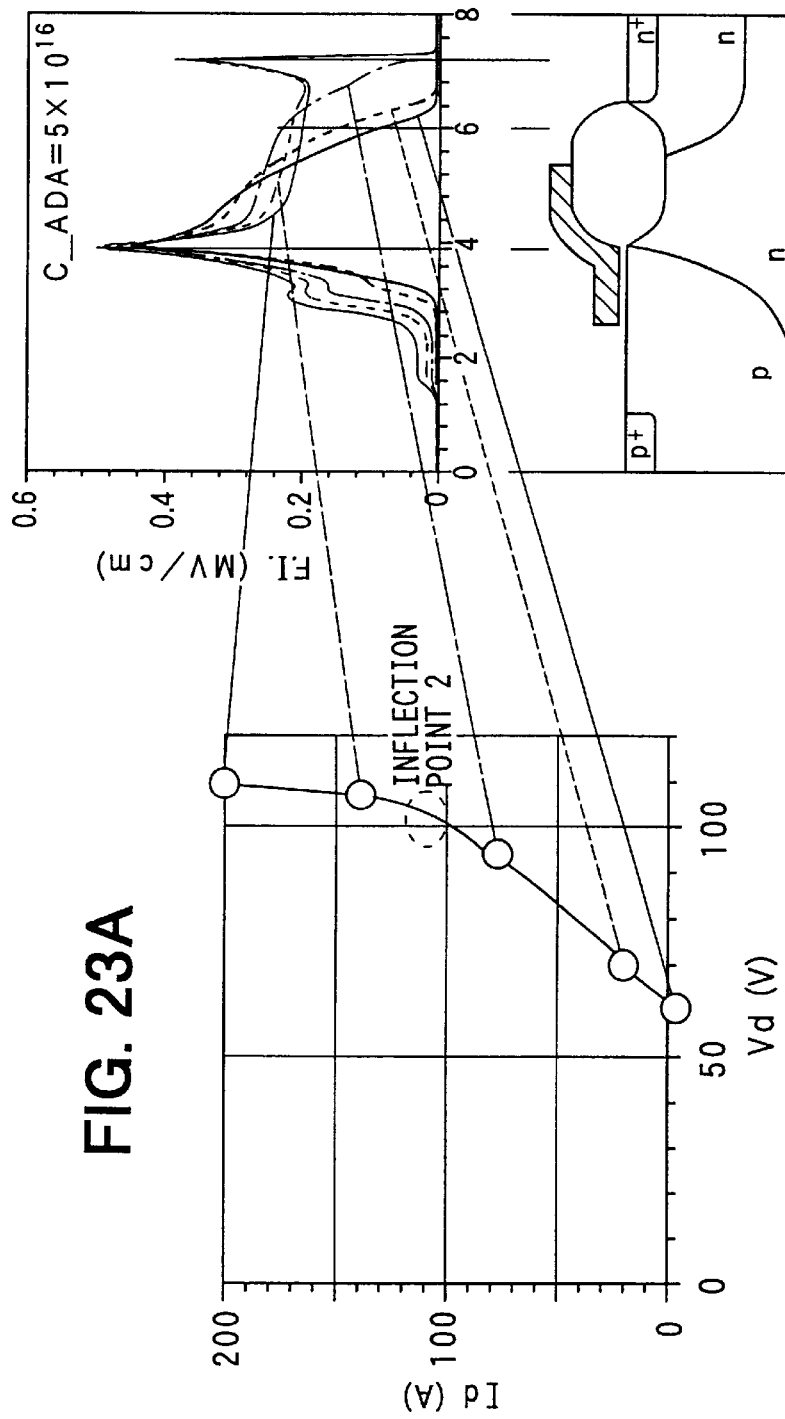

US 6,465,839 B2

SEMICONDUCTOR DEVICE HAVING LATERAL MOSFET (LDMOS)

CROSS REFERENCE TO RELATED APPLICATIONS

This application is based on Japanese Patent Application Nos. 2000-106991 filed on Apr. 7, 2000, and 2000-398749, filed on Dec. 27, 2000, the contents of which are incorporated herein by reference.

BACKGROUND OF THE INVENTION

1. Field of the Invention

The present invention relates to a lateral MOSFET (LDMOS) in which a source region and a drain region are arrayed in the lateral direction of a semiconductor substrate.

2. Related Arts

A power element has a structure in which several tens thousand to several hundreds thousand small LDMOSs are connected in parallel in general and these LDMOSs are operated at the same time to obtain an output.

However, there has been a problem that when a large current such as ESD (electrostatic discharge) flows through the LDMOSs instantly, the element is destroyed or wires connected to the element melt because the large current does not flow though all of the LDMOSs uniformly, but the large current concentrates on some of the LDMOSs.

Therefore, it has been required to improve a capacity for ESD surge. A high capacity for ESD surge of around 10 kV/mm$^2$ has been required in particular in the field of vehicular application. Although a method of adding external devices such as a capacitor to the outside of the IC chip has been adopted in the past to improve the capacity for ESD surge, such method inevitably increases the cost.

SUMMARY OF THE INVENTION

In view of the problem described above, it is an object of the invention to provide a semiconductor device whose capacity for ESD surge can be improved.

In order to achieve the above-mentioned object, the inventors have studied following points.

A non-uniformity of current at the time of ESD surge occurs due to variations of electrode resistance on a chip for example. The non-uniformity of current occurs because of a wire bonding section, that is, a current flowchange based on awire resistance. In concrete, a current carrying through a LDMOS near the wire bonding section flows well because the wire resistance is small. While a current carrying through a LDMOS far from the wire bonding section does not flow well because the wire resistance is large in comparison with the LDMOS near the wire bonding section.

A circuit in which an ESD surge generating circuit 50a shown in FIG. 13 is connected to an LDMOS chip 50b in which three cells of LDMOSs 51a, 51b and 51c are provided, i.e., a circuit in which the three cells of the LDMOSs 51a through 51c are connected to a high voltage generating circuit and resistors 52 and 53 which correspond to the resistance of wires according to a distance from a wire bonding section are disposed among the drain terminals of the respective LDMOSs 51a through 51c.

When a switch 54 is turned ON, power is supplied from a high voltage power source 55 and a capacitor 56 is charged in the surge generating circuit 50a. Then, when a switch 57 is turned ON after turning OFF the switch 54, an ESD surge current flows through the three cells of the LDMOSs 51a through 51c, respectively. Since an L load 58 is included within the circuit, a large current caused by the ESD surge current flows through the three cells of the LDMOSs 51a through 51c at this time.

Then, when the inventors conducted a simulation analysis with such circuit, drain currents Id1 ID2 and Id3 of the respective MOSFET 51a through 51c and drain voltages Vd1, Vd2 and Vd3 of the respective MOSFET 51a through 51c were represented is as shown in FIG. 14.

As it is apparent from this chart, although the drain current Id1 flowing through the LDMOS 51a directly connected with the power supply line suddenly increases from the start of a concentration of current, the drain currents Id2 and Id3 flowing through the LDMOSs 51b and 51c connected to the power supply line via the resistors 52 and 53 decrease.

It is because a current-voltage characteristics of the LDMOS has a negative resistance. Namely, the current flowing through the LDMOS 51a comes into values on a negative resistance region so that a positive feedback occurs and a drain voltage drops when the concentration of current starts as indicated by the upward arrow in the in FIG. 15, while currents flowing through each of the LDMOSs 51b and 51c does not come into the values on the negative resistance region, thereby dropping the currents flowing through the LDMOSs 51b and 51c with drop of each drain voltage as indicated by a downward arrow in FIG. 15.

The negative resistance occurs when a voltage between a source and a drain decreases although the drain current is still increasing. This voltage drop occurs due to the fact that a width of the depletion layer at a PN junction does not vary although the drain current is still increasing.

That is, although the voltage between the source and the drain corresponds to an integral value of electric field strength between the source and the drain, the voltage between the source and the drain is decreased because the field strength drops when the drain current becomes a large current. As a result, the negative resistance occurs.

The inventors obtained results shown in FIGS. 16A and 16B by simulating changes of a distribution of field strength under two different conditions, i.e., the drain current is 20A and the drain current is 200A. The field strength at a part A–A' in FIGS. 16A and 16B is shown in FIG. 17. It also can be seen from the result that the voltage between the source and the drain, which corresponds to the integral value (area) of the field strength between the source and the drain, decreases when the drain current increases, thus causing the negative resistance.

As described above, the LDMOS has the negative resistance shown in FIG. 15. As a resistance of the LDMOS 51a is inside of the negative resistance region, a current flowing through the LDMOS 51a increases with a decrease of voltage applied between a source and a drain of the LDMOS 51a. However, resistance between a source region and a drain region in each of the LDMOSs 51b and 51c is outside of the negative resistance region, so that the current applied to each of the LDMOSs 51b and 51c decreases.

Therefore, the ESD surge current concentrates on the LDMOS 51a, thus destroying the element of the LDMOS 51a or melting a wire connected with the LDMOS 51a.

After all, it is possible to prevent the local concentration of the ESD surge current and to improve the capacity for ESD surge by improving the negative resistance described above. The inventors studied about the improvement of the negative resistance.

The negative resistance occurs while the drain current is still increasing although a width of the depletion layer at a PN junction does not vary as described above. Accordingly, the inventors considered that the negative resistance may be improved by modifying a structure by which the width of the depletion layer formed at the PN junction may is acquired, i.e., by modifying a structure in which the depletion layer hardly extends in the vicinity of the drain region.

Then, as a result of trials and errors, the inventors devised an LDMOS shown in FIG. 18 as the structure satisfying the above conditions.

The LDMOS has a structure in which a drain region is surrounded by an n-type region 6. An impurity concentration in the n-type region 6 is set so that the impurity concentration gradually increases from a semiconductor layer 1 to the drain region 5. In other words, the closer to the drain region 5 centering on the drain region 5, the denser the concentration of n-type impurity concentration in the n-type region 6 becomes.

The inventors conducted a simulation analysis to simulate how the negative resistance changes by changing the impurity concentration in the n-type region 6, or more concretely an impurity concentration in a surface part of the n-type region 6 (hereinafter referred to as a surface concentration).

FIG. 19 shows a result. It is noted that the above-mentioned analysis was carried out by the simulation under a diffusion condition that the surface concentration in the n-type region 6 is changed within a hatched range in FIG. 20. More specifically, the analysis was carried out by changing the surface concentration in the n-type region 6 within a range from a surface concentration which is equal to the case when no n-type region 6 is provided to a surface concentration of approximately $2 \times 10^{17}$ cm$^{-3}$ under a diffusion condition that a concentration at the depth of 2 µm from the surface of the substrate turns out to be 1/10 of the surface concentration as shown in FIG. 20.

It can be seen from this result that two inflection points 1 and 2 exist in the current-voltage characteristics. It is considered that one of factors for these two inflection points 1 and 2 may be that a parasitic transistor formed by the source region 8, the base region 7 and a drift region (n-type substrate 1) turns ON or that a high electric field region reaches to the drain region 5.

Then, in order to analyze the factor of the two inflection points 1 and 2, the source region 8 of the LDMOS shown in FIG. 18 was eliminated to have a diode structure and a negative resistance of this diode structure was checked out. The result is shown in FIG. 22.

As it is apparent from this result, there is only the inflection point 2 in the diode structure. It can be seen from this result that the inflection point 1 among the two inflection points 1 and 2 was caused by the parasitic transistor.

Then, it can be seen that the inflection point 2 shifts to high values of the current Id with increase of the surface concentration in the n-type region 6. It also can be seen from FIG. 22 that the inflection point 2 occurs by a breakdown of the PN junction at a time when an expansion of the depletion layer is suppressed due to a high concentration of the drain region after reaching the drain region, whereby an electric field becomes strong.

On this account, it is possible to arrange such that a current value, from which a resistance between the source region and the drain region of the LDMOS change into the negative resistance region, increases. In other words, the resistance between the source region and the drain of the LDMOS hardly come into the negative resistance region in the current-voltage characteristics by increasing the surface concentration.

Accordingly, it is possible to prevent the resistance between the drain region and the source region of one or some of the LDMOSs from being in the negative resistance region in low level of the current flowing through the LDMOS and to prevent the large current from locally flowing, thereby improving the capacity for the ESD surge.

Meanwhile, it is considered that the remaining inflection point 2 may occur due to the fact that a high electric field region extends and reaches to the drain region 5. Then, the inventors simulated a distribution of electric field strength to check out how the high electric field region extends by setting the surface concentration in the n-type region 6 at a predetermined value (here, $5 \times 10^{16}$ cm$^{-3}$) and by changing the value of drain current. As a result, the result shown in FIG. 23b was obtained. It is noted that a horizontal axis of the distribution of field strength in FIG. 23b corresponds to a lateral direction of the diode structure shown in FIG. 23c.

As it is apparent from this chart, the high electric field region extends toward the drain region with an increase of the drain current. Therefore, it is possible to prevent the resistance between the drain region and the source region of one or some of the LDMOSs from being in negative resistance region even when the ESD surge occurs by arranging so that the high electric field region reaches to the drain region when the drain current becomes equal to or greater than that at the time of ESD surge (200 A for example).

As described above, it is possible to increase the current value when the resistance between the drain region and the source region of the LDMOS is in the negative resistance region by increasing the surface concentration of the n-type region.

Further, it is possible to prevent the resistance between the drain region and the source region of the LDMOS from being in the negative resistance region more by setting the surface concentration of the n-type region so that the high electric field region reaches to the drain region when the drain current becomes equal to or greater than that at the time of ESD surge.

It is also possible to sift the inflection point 1 which also may be caused by the parasitic transistor and to prevent the resistance between the drain region and the source region of the LDMOS from being in the negative resistance region by constructing the LDMOS having the structure in which the parasitic transistor hardly turns ON.

According to the present invention, a first conductive type region is provided between a drain region and a base region on a surface layer part of a semiconductor layer. The first conductive type region is constructed so that its concentration is higher than that of the semiconductor layer and this concentration gradually increases from the semiconductor layer to the drain region.

As mentioned above, a current value at which a resistance between the source region and the drain region of a LDMOS comes into the negative resistance region can be increased and the capacity for ESD surge can be improved by disposing the first conductive type region between the drain region and the base region.

According to another aspect of the present invention, a second conductive type region is provided so as to contact to a lower part of the source region, the second conductive type region has a concentration higher than that of the base region.

The parasitic transistor hardly turns ON by providing the second conductive type region. Thereby, it is possible to prevent the resistance between the drain region and the source region of the LDMOS from coming into the negative resistance region and to improve the capacity for ESD surge.

In this case, it is preferable to dispose the second conductive type region away from the channel region.

It is preferable to form the first conductive type region before forming the drain region on a surface layer part of a semiconductor layer It is preferable to form the first conductive type region by ion-implanting first conductive type impurity at a dosage of $1 \times 10^{14}$ cm$^{-2}$ or less. With such dosage, it is possible to make a concentration of the first conductive type region to a degree such that a sustain characteristics becomes positive reliably.

It is preferable to set the dosage of the first conductive type impurity at $2 \times 10^{13}$ cm$^{-2}$ or more. With such dosage, it is possible to make the concentration of the first conductive type region to a degree such that a depletion layer extending within the first conductive type region does not reach to the drain region.

It is preferable to set a depth of the first conductive type region at 2 to 4 pm. It is possible to prevent an interface of an oxide film (LOCOS (LOCal Oxidation of Silicon) film) from becoming unstable due to a suction (absorption) of the impurity to the oxide film by setting the depth of the first conductive type region at 2 µm or more as described above. It is also possible to prevent ON resistance from increasing due to an increase of a gap between the source and the drain by setting the first conductive type region at 4 µm or less.

It is preferable to carry out the step for forming the contact region by high acceleration ion implantation. In this way, a contact region is formed at a position deeper than the surface portion the semiconductor layer. Therefore, a concentration in a channel part may be suppressed low even if a concentration of the contact region is increased.

BRIEF DESCRIPTION OF THE DRAWINGS

Other objects, features and advantages of the present invention will become more apparent from the following detailed description made with reference to the Note accompanying drawings. In the drawings:

FIG. 23A is a graph explaining the negative resistance of the device shown in FIG. 21;

FIG. 23B is a graph showing field intensity in the device shown in FIG. 21; and

FIG. 23C is a schematic sectional view explaining a range of Y axis in FIG. 23B.

DESCRIPTION OF THE PREFERRED EMBODIMENT (First Embodiment)

Figure 1:
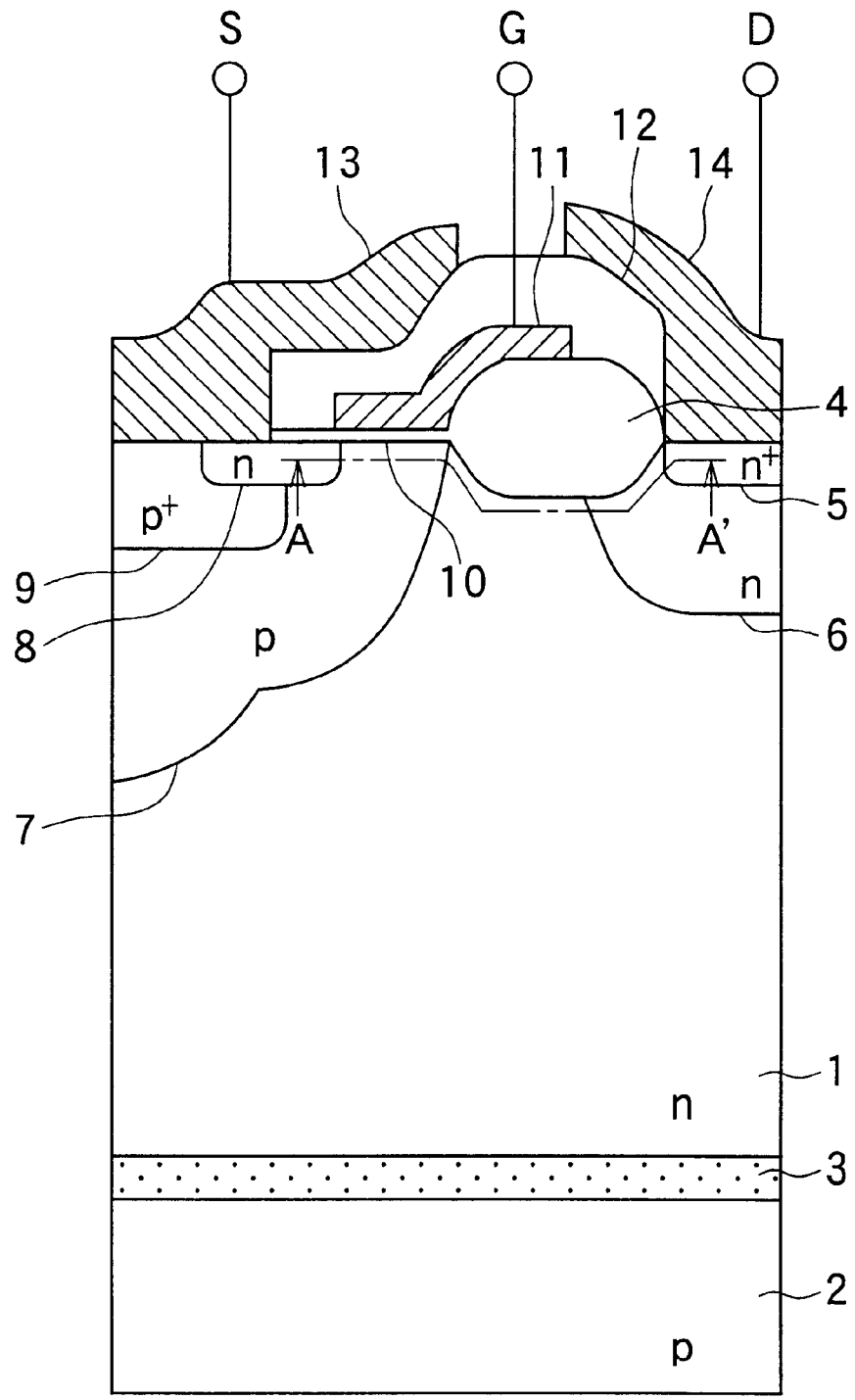
FIG. 1 shows a sectional view of an LDMOS in a first embodiment.

FIG. 1 shows the sectional structure of an LDMOS to which one embodiment of the present invention is applied. The structure of the LDMOS of this embodiment will be explained below based on FIG. 1.

The LDMOS is formed on an SOI substrate in which a n-type substrate (semiconductor layer) 1 is pasted with a p-type substrate 2 with an insulating film 3 made of a silicon oxide film interposed therebetween.

An impurity concentration of the n-type substrate 1 is approximately between $1 \times 10^{15}$ and $1 \times 10^{16}$ cm$^{-3}$. An insulating film 4 is formed on a surface of the n-type substrate 1. An n$^+$-type drain region 5 whose concentration is high is formed on the surface layer of the n-type substrate 1 so as to contact with the insulating film 4. Then, an n-type region 6 is formed so as to surround the n$^+$-type drain region 5. The n-type region 6 is formed so as to extend below the insulating film 4. An impurity concentration of the n-type region 6 is set so that the concentration gradually increases from the substrate 1 to the n$^+$-type drain region 5.

A p-type base region 7 is also formed on the surface layer of the n-type substrate 1. The p-type base region 7 reaches a vicinity of an edge of the insulating film 4. It is noted that a depth of the p-type base region 7 is partly deep. This deepened region acts as a deep base layer.

An n$^+$-type source region 8 is formed on a surface layer part of the p-type base region 7 so as to separate from the insulating film 4. A p$^+$-type contact region 9 is also formed on the surface layer part of the p-type base region 7 so as to contact with the n+-type source region 8. The p+-type contact region 9 is disposed on an opposite side from the n+-type drain region 5 interposing the n+-type source region 8 therebetween, and extends below an under layer part of the n+-type source region 8.

A gate insulating film 10 is disposed on the surface of the p-type base region 7 interposed between the n+-type source region 8 and the n+-type drain region 5. A gate electrode 11 is provided on the gate insulating film 10.

A MOS operation is conducted by setting a surface portion of the p+-type base region 7 positioned below the gate electrode 11 as a channel region and by setting the n-type substrate 1 as a n-type drift region.

An interlayer insulating film 12 is disposed so as to cover the gate electrode 11. A source electrode 13 a drain electrode 14 are patterned on the interlayer insulating film 12. The source electrode 13 is connected with the n+-type source region 8 and the p+-type contact region 9. The drain electrode 14 is connected with the n+-type drain region 5 through a contact hole formed in the interlayer insulating film 12.

It is noted that although not shown, a surface of the SOI substrate is covered by a protecting film or the like so as to cover the source electrode 13 and the drain electrode 14.

A relationship on concentration of respective components of the LDMOS will be explained by showing the concentration profile at a part A–A' in FIG. 1.

Figure 2:
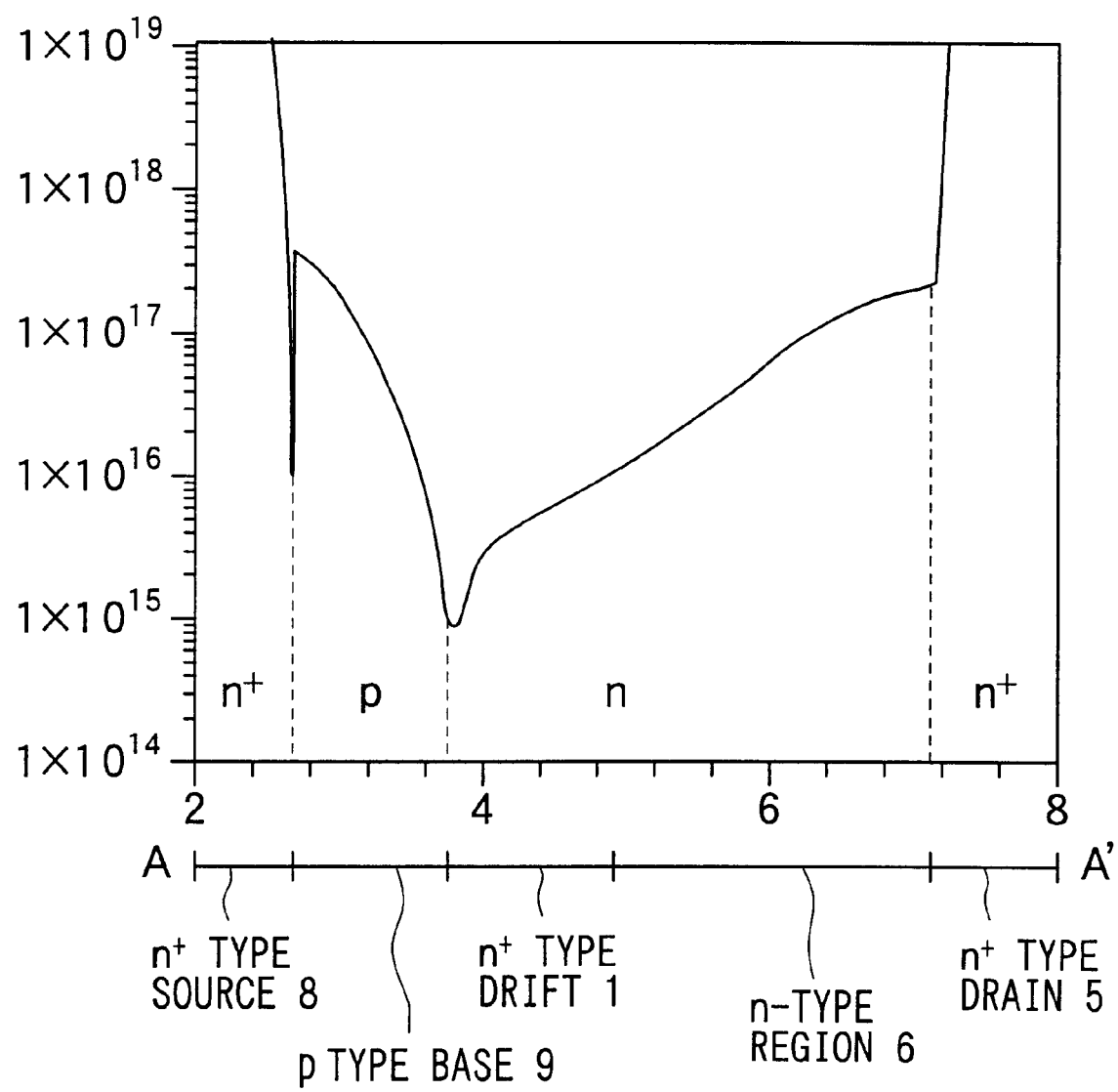
FIG. 2 is a graph showing the concentration profile in part A–A' in FIG. 1.

As shown in FIG. 2, a concentration of n-type impurity is very high in the n+-type source region 8 and the n+-type drain region 5. On the contrary, although concentration in the n-type region 6 is not as high as the n+-type source region 8 and the n+-type drain region 5, the concentration is higher than that of the n-type substrate 1. This concentration is arranged so that the concentration gradually increases from the n-type substrate 1 to the n+-type drain region 5. In concrete, the n-type region 6 has a concentration gradient so that a surface concentration at a part of the n-type region 6 contacting with the n+-type drain region 5 is approximately $5 \times 10^{16}$ to $2 \times 10^{17}$ cm$^{-3}$ for example.

That is, the LDMOS of the this embodiment is constructed so that the n-type region 6 whose concentration is higher than that of the n-type substrate 1 is formed so as to surround the n+-type drain region 5 and so that a high electric field region extending though the n-type region 6 reaches to the n+-type drain region 5 when drain current becomes equal to or greater than that at the time of ESD surge.

Thus, the high electric field region is suppressed to extend even if large drain current is likely to flow by forming the n-type region 6 whose concentration is higher than that of the n-type substrate 1 so as to surround the n+-type drain region 5. That is, the high electric field region hardly reaches the n+-type drain region 5. As a result, it becomes possible to keep a voltage applied between the source region 8 and the drain region 5 corresponding to an integral value of electric field strength between the source region 8 and the drain region 5 high.

Figure 19:
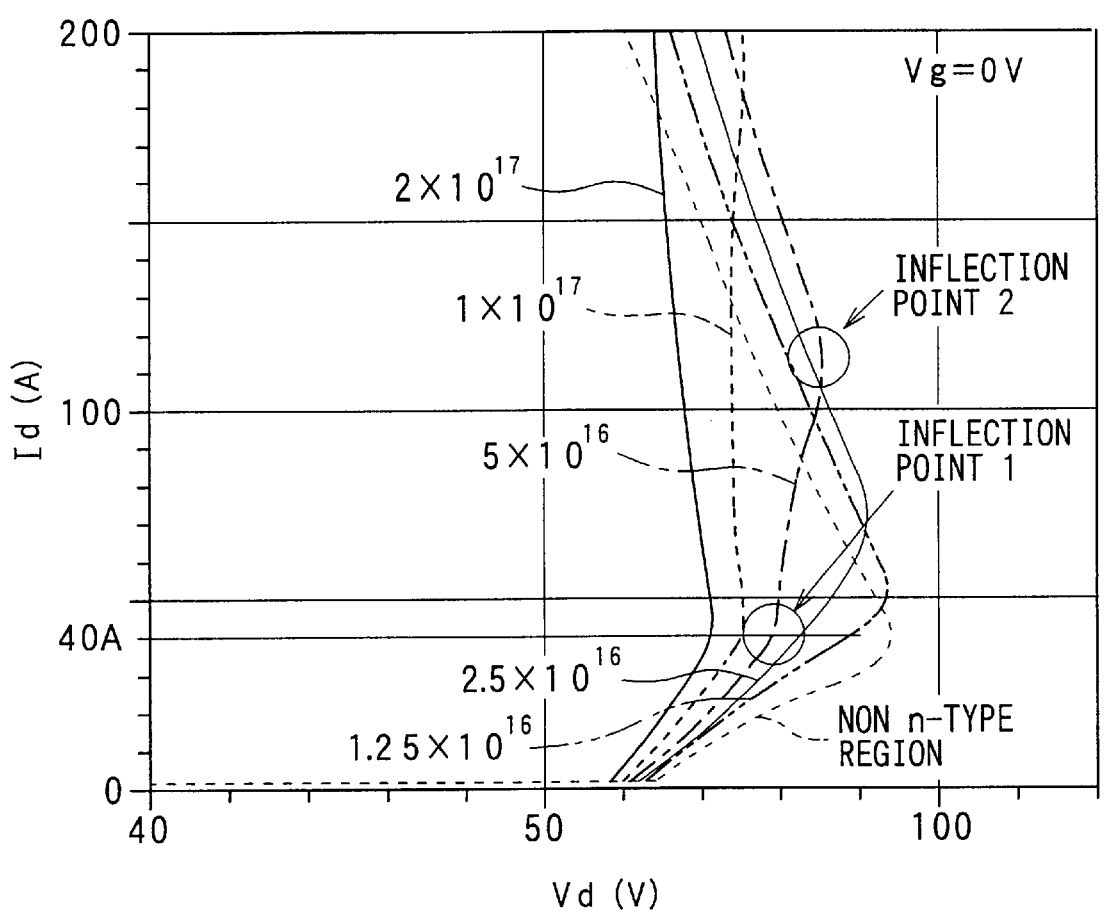
FIG. 19 is a chart showing a relationship between a change of concentration and the negative resistance of the LDMOS.
Figure 20:
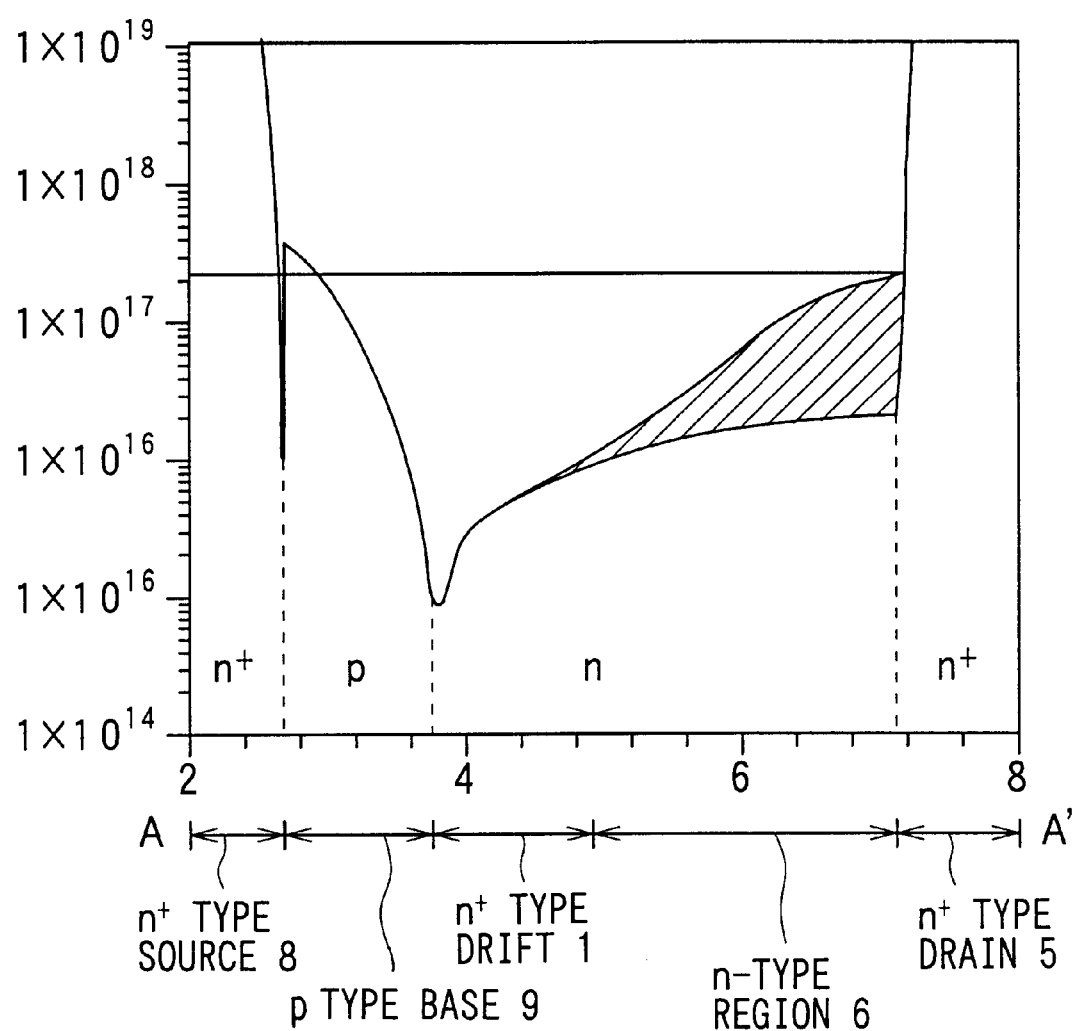
FIG. 20 is a concentration profile of the LDMOS shown in FIG. 18.
Figure 21:
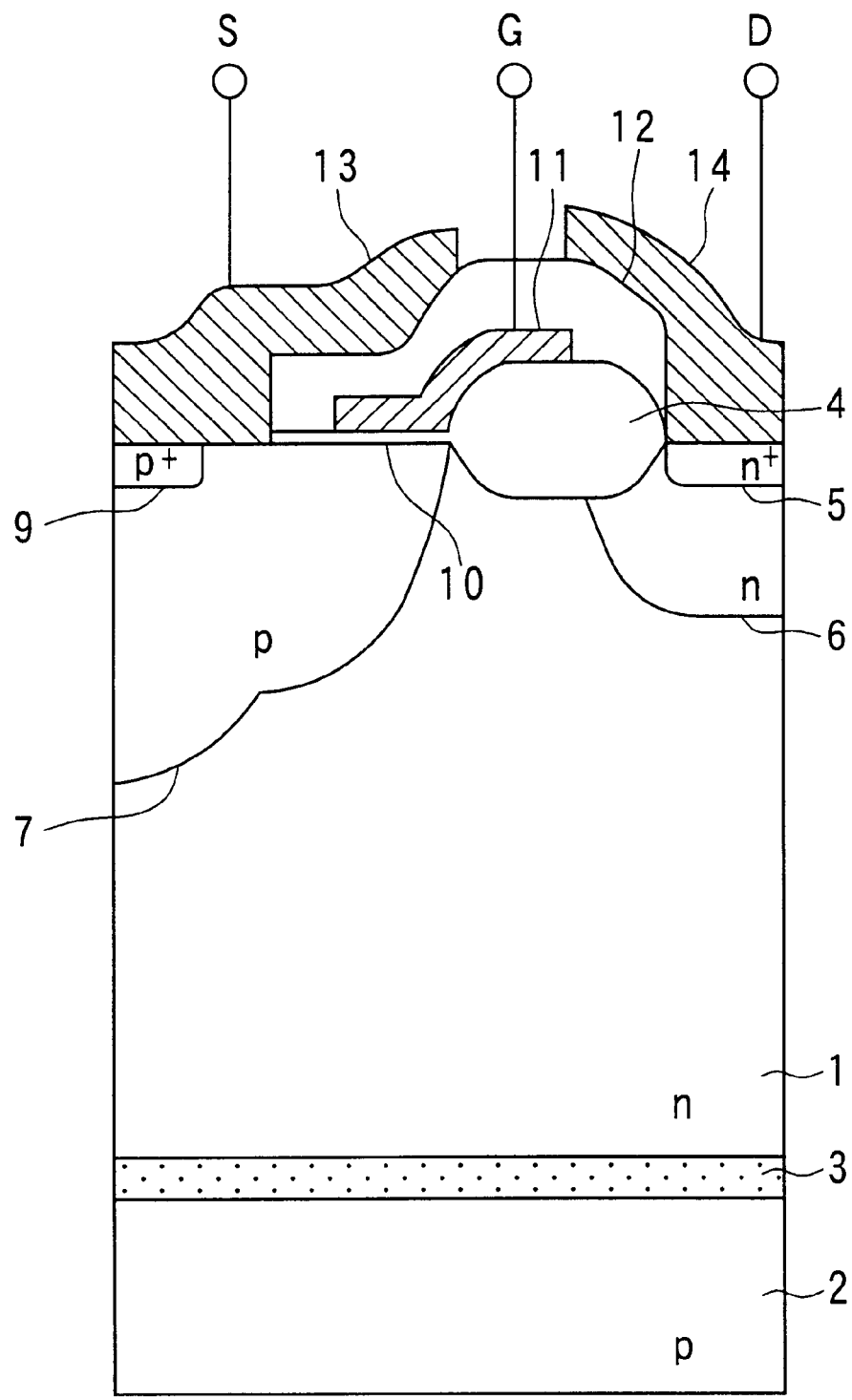
FIG. 21 is a schematic sectional view of a device having a diode structure in which a source region is eliminated from the LDMOS shown in FIG. 18.
Figure 22:
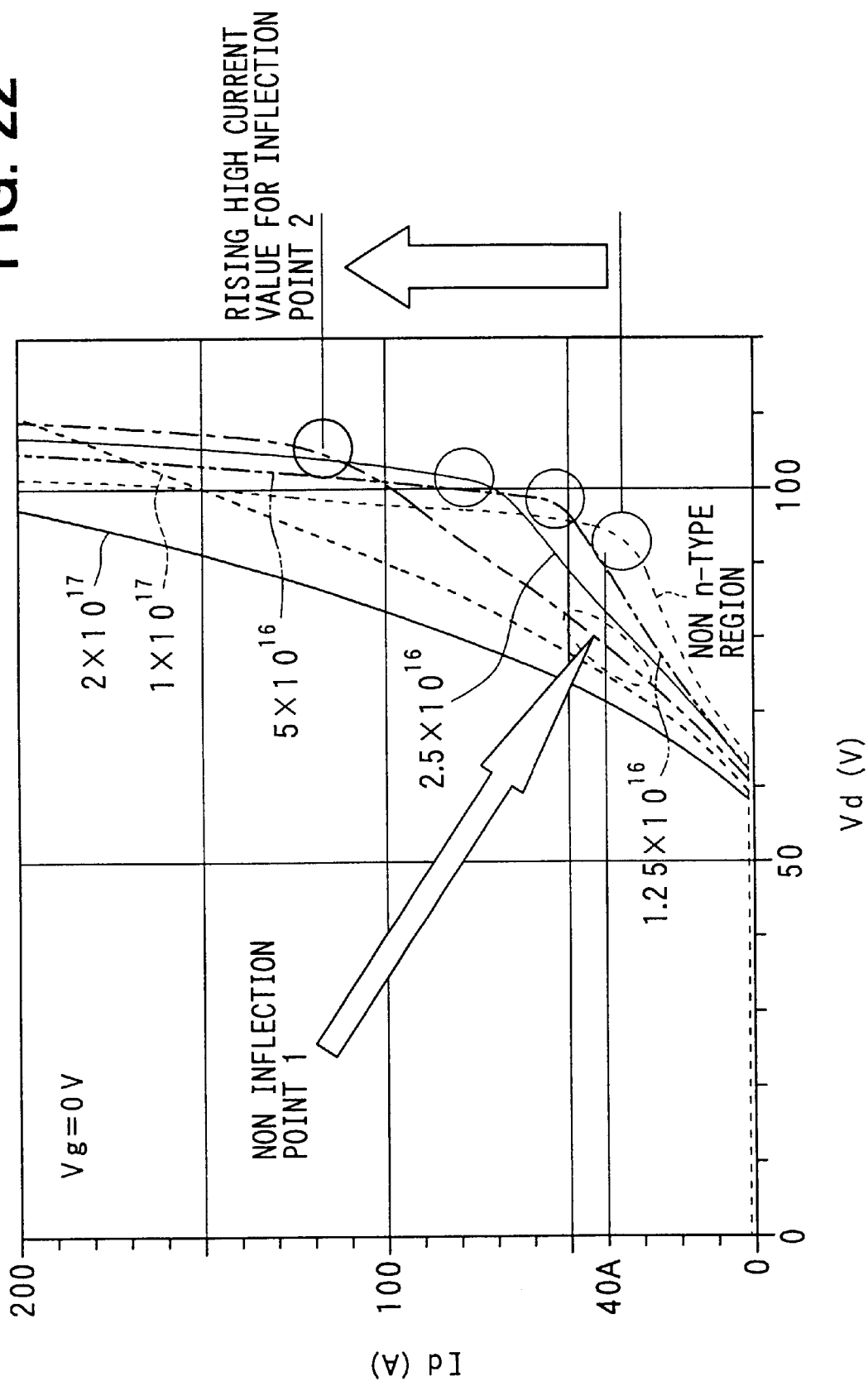
FIG. 22 is a chart showing the negative resistance of the diode structure shown in FIG. 21.

Therefore, it becomes possible to prevent a decrease of the voltage between the source region 8 and the drain region 5 caused by a condition that a extension of a high electric field region caused when the ESD surge occurs reaches to the n+-type drain region 5. On this account, a current value when the resistance between the source region 8 and the drain region 5 of the LDMOS is inside of a negative resistance region can be large. Thus, it becomes possible to improve one of two inflection points shown in FIG. 19 and to prevent the resistance between the source region 8 and the drain region 5 of the LDMOS from being inside of the negative resistance region even at the time of ESD surge.

Further, it is possible to increase the current value when the resistance between the source region 8 and the drain region 5 of the LDMOS comes into the negative resistance region without increasing the concentration of the n-type region 6 too much by controlling the impurity concentration of the n-type region 6 so that the high electric field region reaches to the n+-type drain region 5 when the drain current increases to be equal to or greater than a value in occurring the ESD surge.

Meanwhile, the LDMOS of this embodiment is constructed so that the p+-type contact region 9 extends below the n+-type source region 8. More specifically, the p+-type contact region 9 is formed so as to extend below the n+-type source region 8 and so as not to reach the channel region. That is, the p+-type contact region 9 is formed so as to extend below the n+-type source region 8 to such a degree that the p+-type contact region 9 does not affect in forming the channel region.

The high concentrate p+-type region is disposed between the n+-type source region 8 and the p-type base region 7 and a PNP parasitic transistor formed by the n+-type source region 8, the p-type base region 7 and the n-type substrate 1 (n-type drift region) hardly turns ON by constructing as described above.

Thereby, it becomes possible to improve the inflection point caused by the parasitic transistor and to prevent the LDMOS from being in a state of the negative resistance region further by constructing the LDMOS such that the parasitic transistor will not turn ON.

Figure 3:
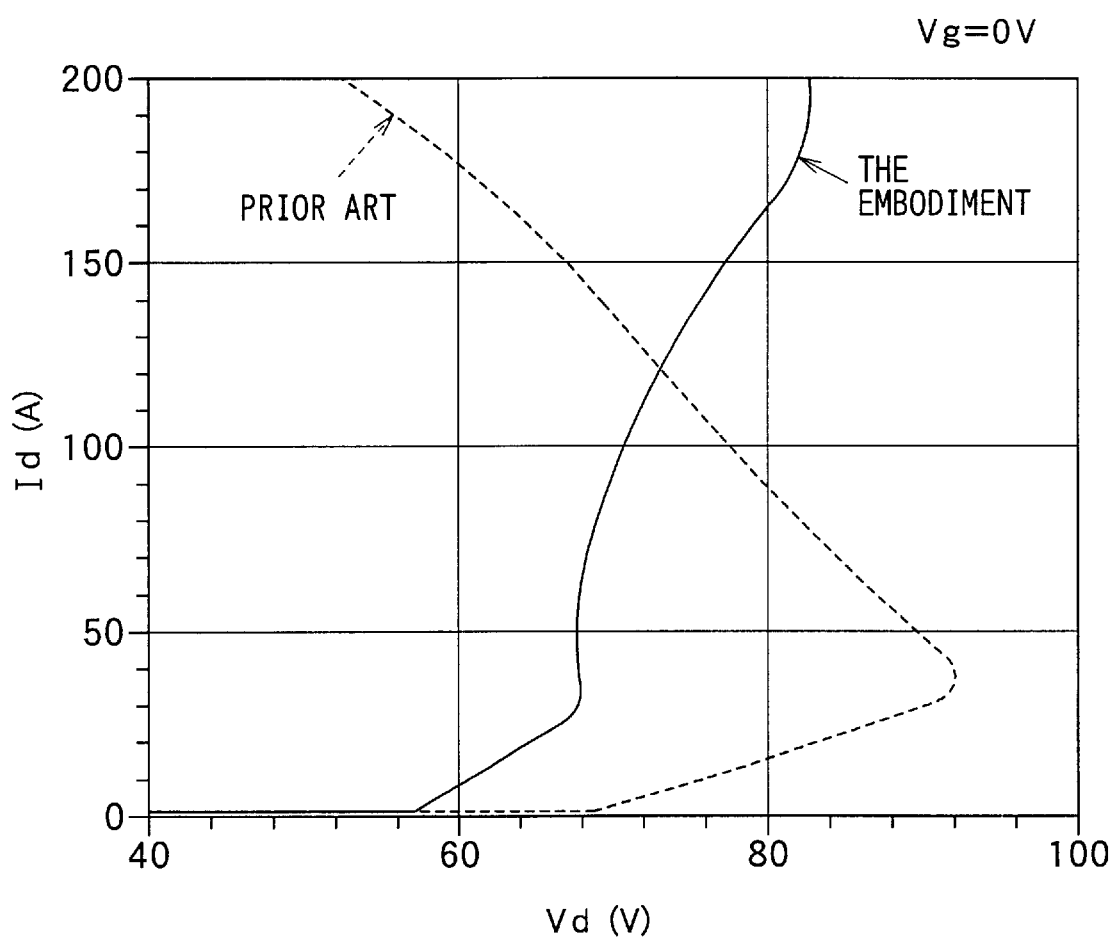
FIG. 3 is a chart showing the current-voltage characteristics when the LDMOS shown in FIG. 1 breaks down.

A current-voltage (Vd-Id) characteristics of the LDMOS constructed as described above at the time of breakdown is shown in FIG. 3. A characteristics that a voltage Vd is not reduced even if a drain current Id is still increasing is obtained in a scope when a maximum value of the drain current Id which may occur at the time of ESD surge is assumed to be 200 A or less. That is, the inventor obtained the characteristics that the current value coming into the negative resistance region is 200 A or more.

Figure 4:
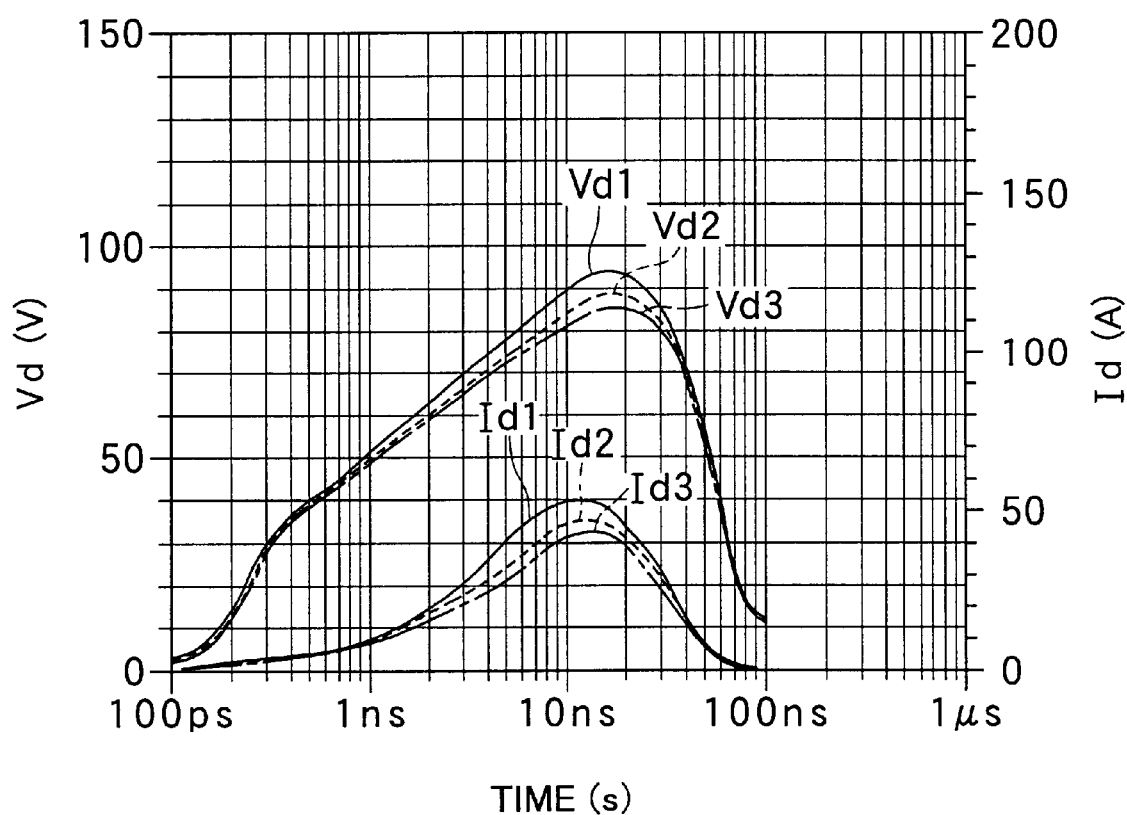
FIG. 4 is a simulating chart for drain current and drain voltage of the LDMOS shown in FIG. 1.
Figure 13:
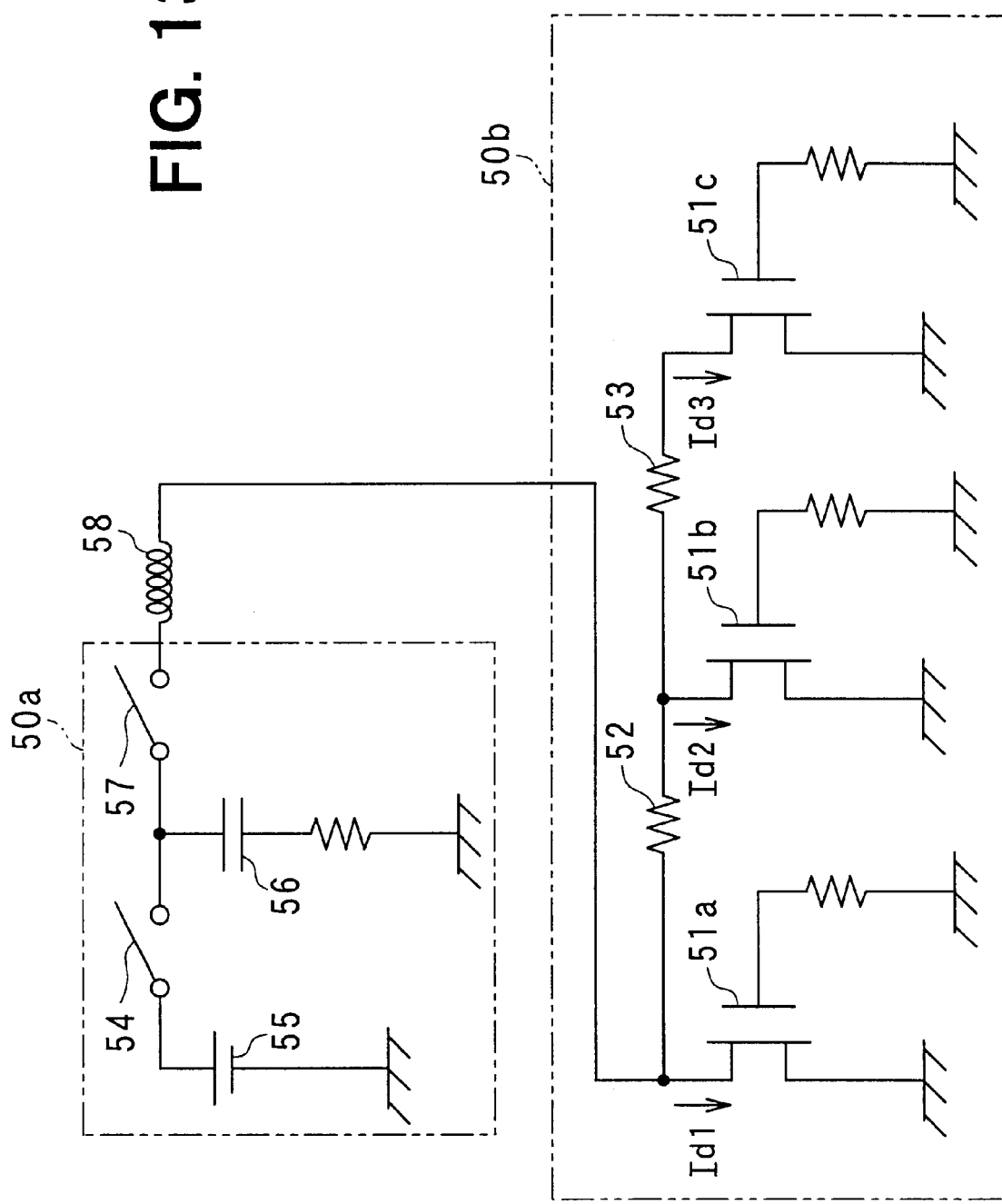
FIG. 13 is a circuit diagram for generating an ESD surge.
Figure 14:
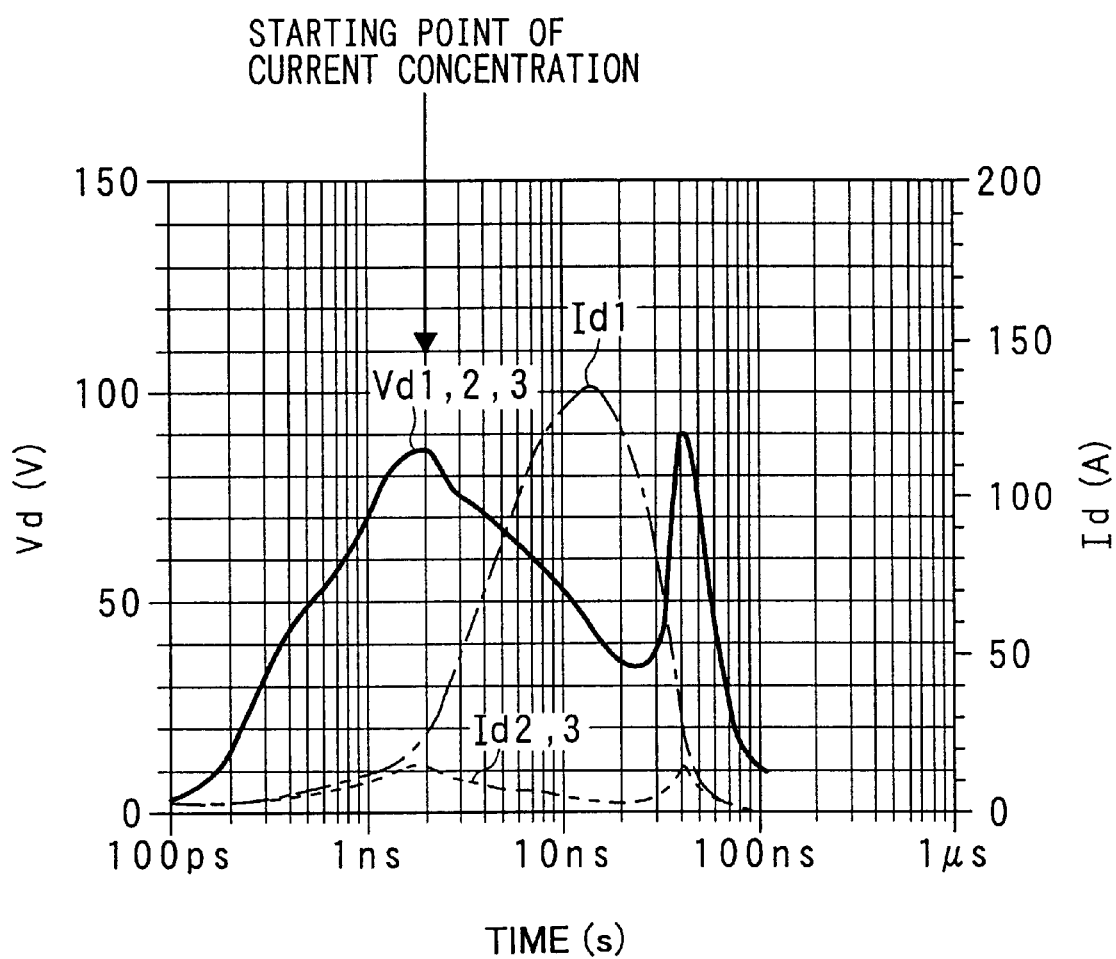
FIG. 14 is a simulating chart for a drain current and a drain voltage by using the circuit shown in FIG. 13.
Figure 15:
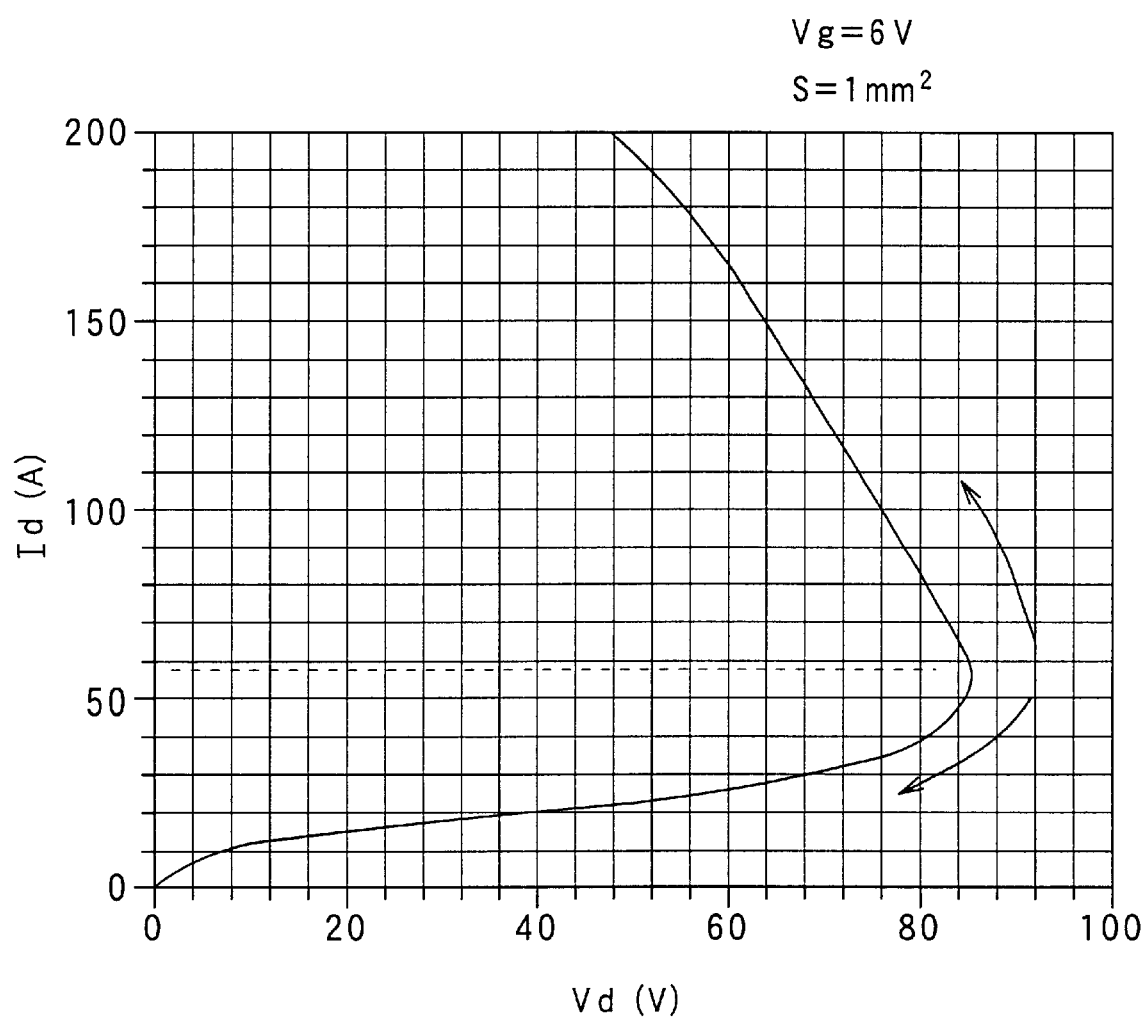
FIG. 15 is a graph explaining the negative resistance of the LDMOS.
Figure 16A:
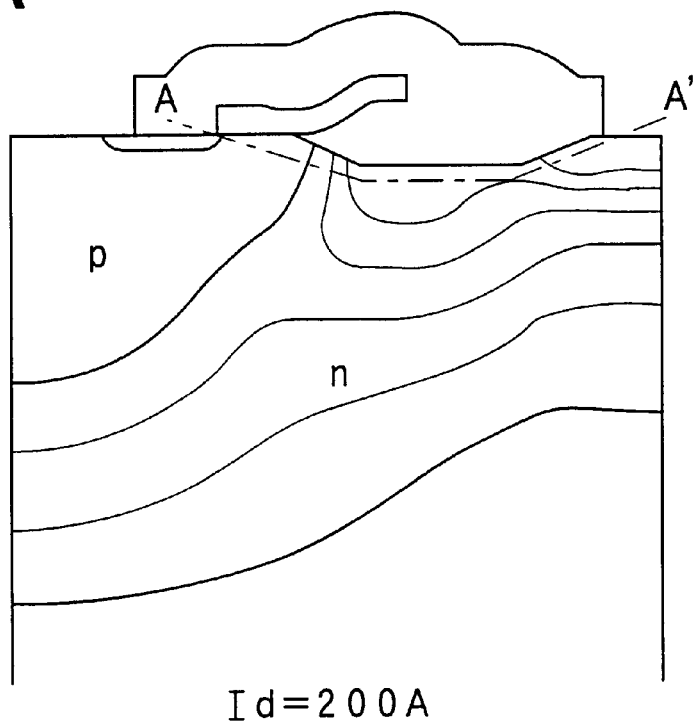
FIGS. 16A and 16B are graphs showing distributions of electric field intensity when current values are different.
Figure 16B:
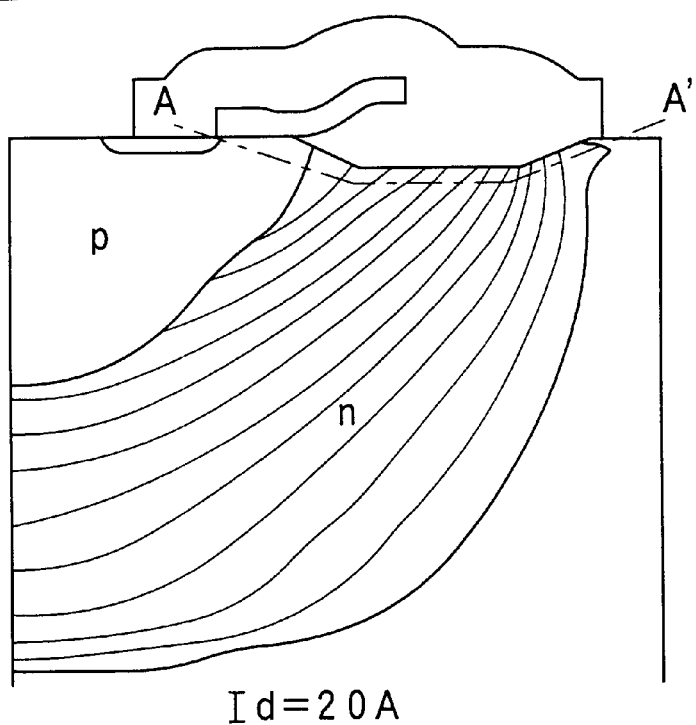
Figure 17:
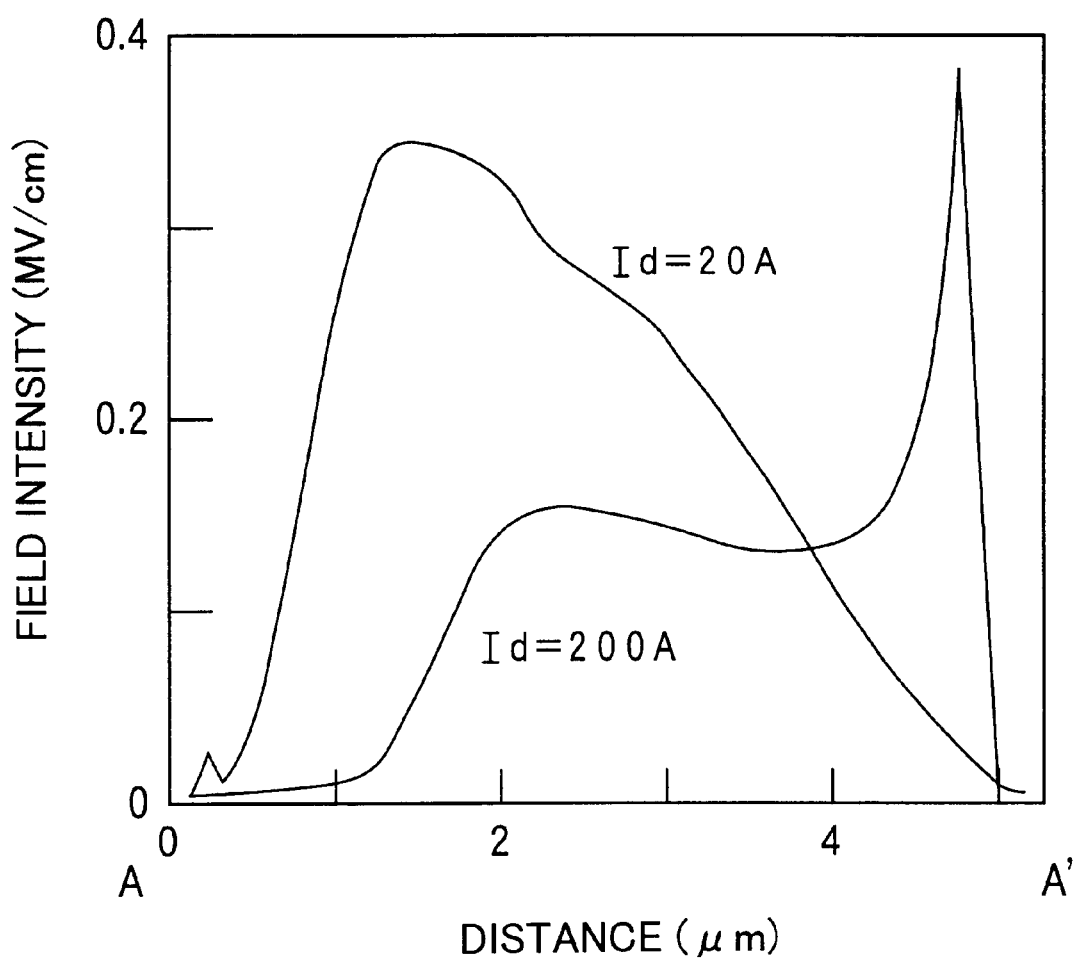
FIG. 17 is a graph showing field intensity in part A–A' in FIGS. 16A and 16B.
Figure 18:
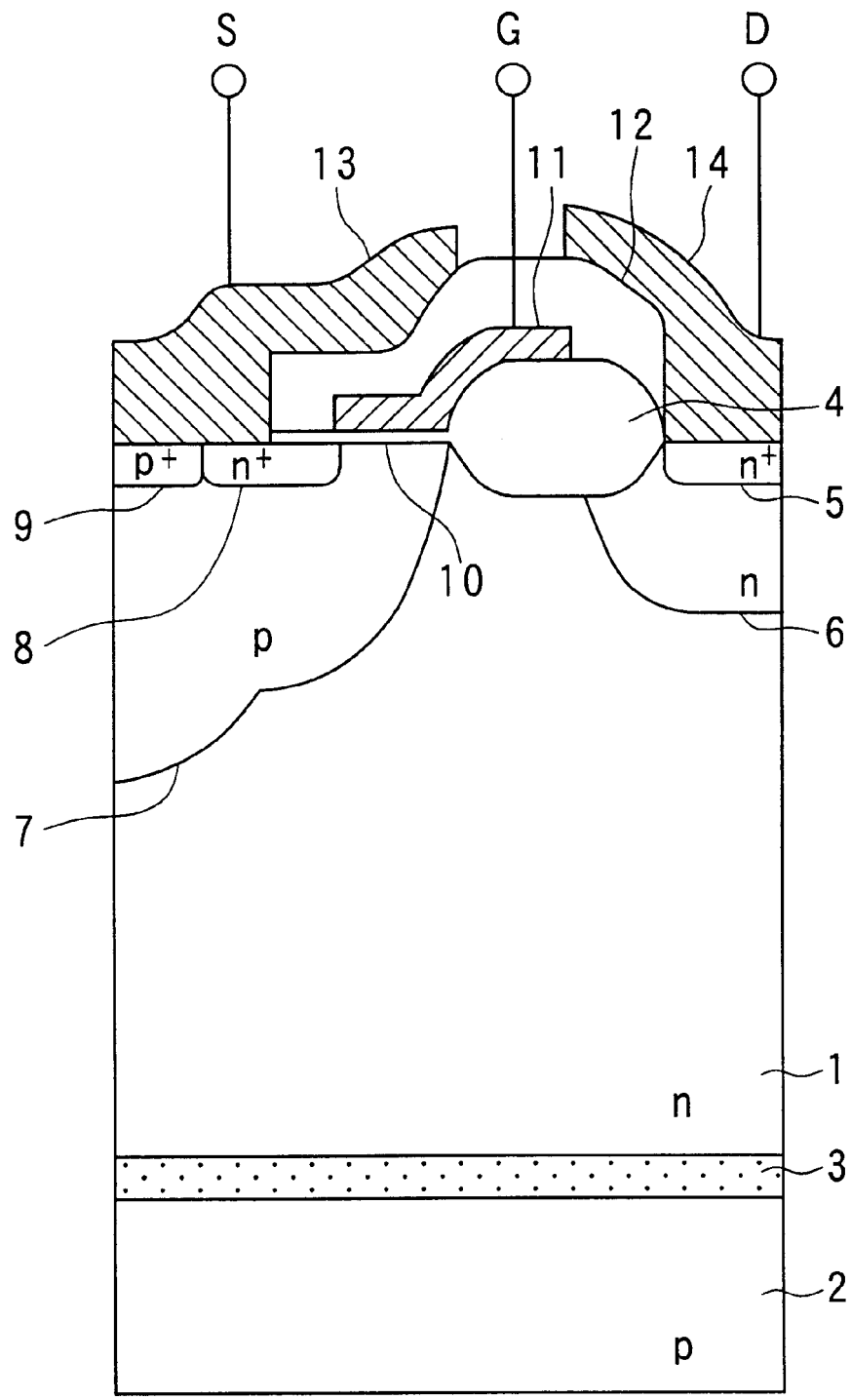
FIG. 18 is a sectional view of an LDMOS.

Then, when the inventor simulated and analyzed a LDMOS constructed as described above by connecting three cells of LDMOSs as shown in FIG. 13. Drain currents Id1, Id2 and Id3 of the respective LDMOSs 51a through 51c and the drain voltages Vd1, Vd2 and Vd3 of the respective LDMOSs 51a through 51c were represented as shown in FIG. 4.

As it is apparent from this graph, the drain current Id1 flowing through the LDMOS 54a directly connected with a power supply line is almost the same values as the drain currents Id2 and Id3 flowing through the LDMOSs 54b and 54c connected with the power supply line through resistors 55 and 56. Namely, it not occurred that only the drain current Id1 suddenly increases. Each of the drain voltages Vd1, Vd2 and Vd3 does not also drop even though the drain currents Id1 through Id3 increase.

Thus, the capacity for the ESD surge of the LDMOS may be improved by constructing as described above.

It is noted that although the LDMOS of the present embodiment is different from the conventional LDMOSs in a point that the n-type region 6 and the p+-type contact region 9 are formed. These regions may be formed by ion-implanting the impurity to the surface of the n-type substrate 1 or by diffusing in solid phase. Although the n-type region 6 and the p+-type contact region 9 may be formed at any timing, it is preferable to form the n-type region 6 before the n-type drain region 5, the n-type source region 8 and the p⁺-type contact region 9 because it takes long time needs to be thermally diffused.

FIGS. 5 through 8 show one exemplary manufacturing steps of the LDMOS illustrated in the present embodiment and the manufacturing method of the LDMOS will be explained. It is noted that trenches and others related to the trenches which insulate the LDMOS from the other element regions will be illustrated here.

Figure 5A:
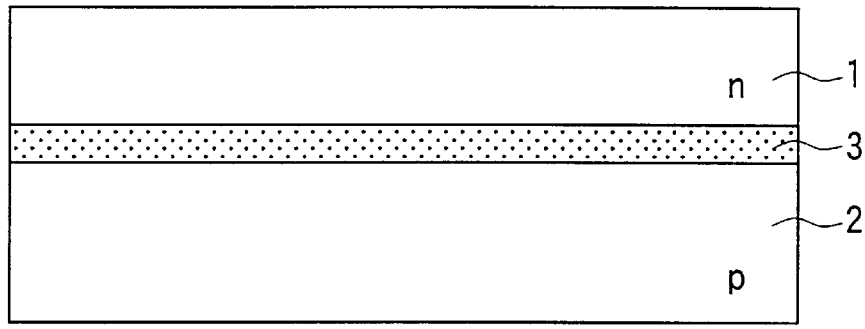
FIG. 5A through 5C are schematic sectional view of the LDMOS shown in FIG. 1 illustrating manufacturing steps of a first embodiment.

[Step in FIG. 5*a*]

The SOI substrate having the insulating film 3 such as an oxide film and an n⁻-type epi-layer (or the n-type substrate) 1 on the p-type substrate 2 is prepared at first. The n⁻-type epi-layer 1 has a n-type impurity concentration of $1\times10^{15}$ cm⁻³ and a thickness of approximately 10 μm. The oxide film 3 has a thickness of about 2 μm.

Figure 5B:
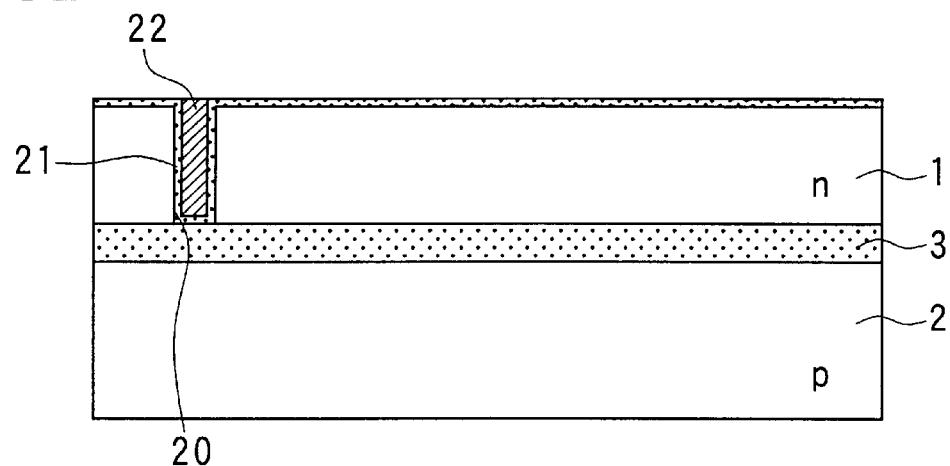

[Step in FIG. 5*b*]

A trench 20 which reaches the insulating film 3 is formed by photo-etching the n⁻-type epi-layer 1. Then, the surface of the n-type substrate 1 including the inner wall of the trench 20 is thermally oxidized to cover the inner wall by a thermal oxide film 21. An element separating region is formed by depositing a polysilicon film 22 so as to bury the inside of the trench 20.

Figure 5C:
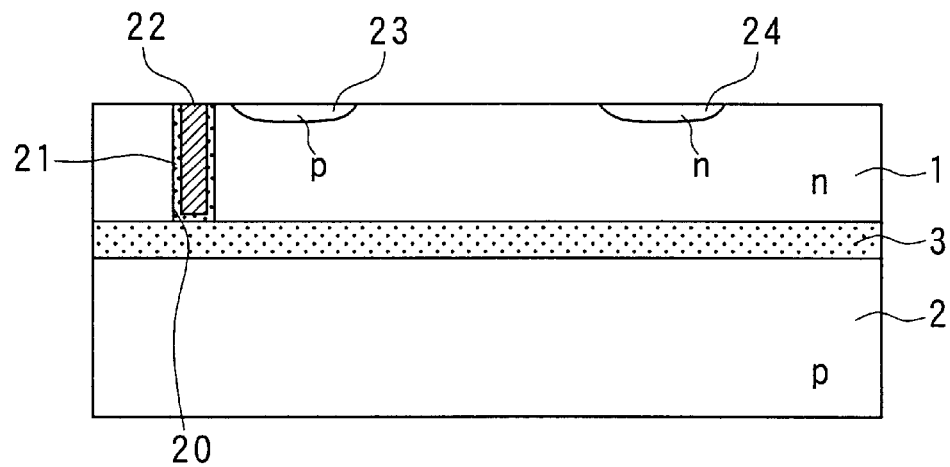

[Step in FIG. 5*c*]

The p-type impurity, e.g., boron, is ion-implanted selectively at an outer periphery region of the LDMOS, and then a n-type impurity, e.g., phosphorus, is ion-implanted selectively on the surface layer part of the n-type epi-layer 1 approximately between $2\times10^{13}$ and $1\times10^{14}$ cm⁻² of dosage. Thereby, a p-type impurity implanted layer 23 and an n-type impurity implanted layer 24 are formed.

Since the dosage of the n-type impurity is $1\times10^{14}$ cm⁻² or less, it is possible to let sustain characteristics become positive steadily and to prevent a depletion layer extending through the n-type region 6 shown in FIG. 1 from reaching to the n⁺-type drain region 5 because the impurity is $2\times10^{13}$ cm⁻² or more.

It is noted that the ion-implantation of p-type impurity in the step shown in FIG. 5*c* can be applied for forming a P well region in a CMOS of a complex IC when the complex IC is formed in the SOI substrate together with the LDMOS.

Figure 6A:
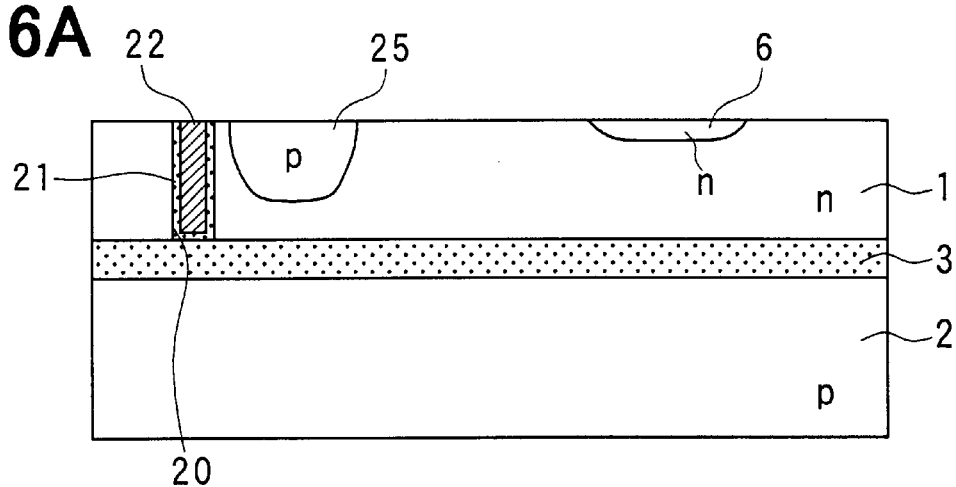
FIG. 6A through 6C are schematic sectional view of the LDMOS shown in FIG. 1 illustrating manufacturing steps of a first embodiment.

[Step in FIG. 6*a*]

A heat treatment is carried out to thermally diffuse the both p-type impurity and n-type impurity implanted in the step shown in FIG. 5*c*. Thereby, the impurity in the respective impurity implanted layers 23 and 24 is diffused., thus forming a p-well region 25 and an n-type region 26. At this time, the interface of the LOCOS oxide film becomes unstable due to a suction of the impurity to the LDMOS oxide film 4 formed in the step later than the ion-implanting step shown in FIG. 6*a* (see FIG. 6*b*) when a diffusion depth of the n-type impurity is shallow, while a wide source-drain interval, which increase an ON resistance, may be provided because an expansion of the diffusion in a lateral direction is estimated when the depth is deep. Therefore, it is preferable to set the diffusion depth approximately between 2 and 4 μm. It is noted that the width of the n-type region 6 is controlled corresponding to the required capacity for pressure because the capacity for pressure is controlled by the width of the n-type region 6.

Figure 6B:
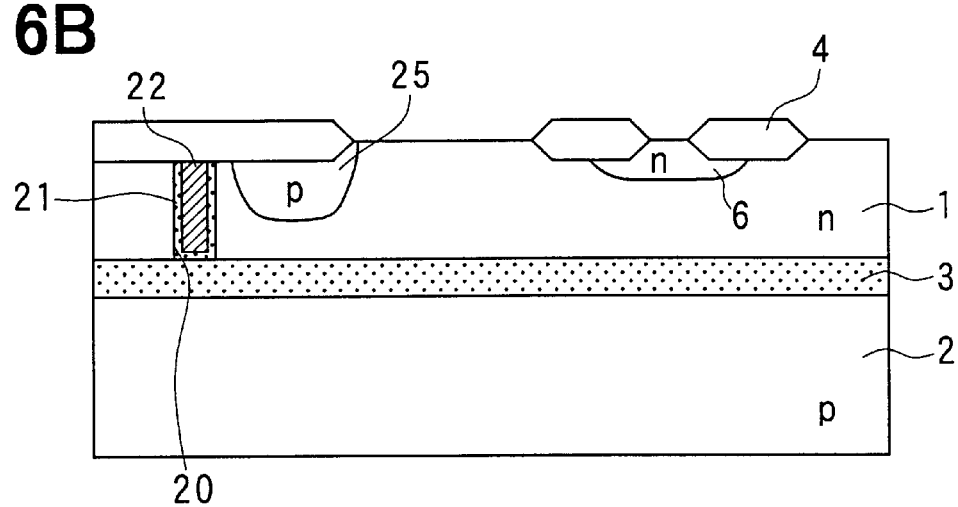

[Step in FIG. 6*b*]

After forming the oxide film and the nitride film in turn, predetermined regions of the nitride film between the n⁺-type drain region 5 and the p-type base region 7 and the p-type well region 25 formed in the later steps (see FIG. 7*c* and 8*a*) are removed. Then, a thermal oxidization is carried out. After that, the oxide and nitride films are removed. On this account, the LOCOS oxide film 4 is formed between the n⁺-type drain region 5 and the p-type base region 7 by the known LOCOS method. The heat in forming the LOCOS oxide film maybe utilized ina diffusion of the n-type impurity by forming the LOCOS oxide film after forming the n-type region 6.

Figure 6C:
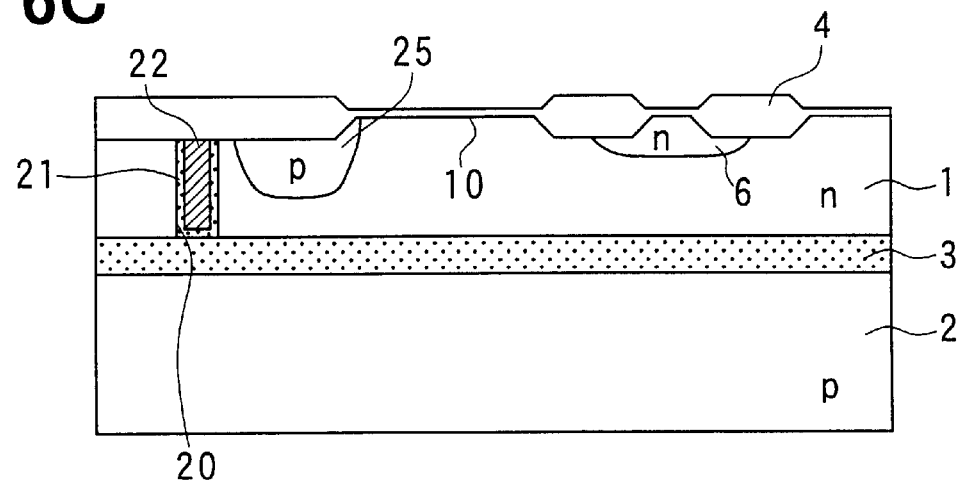

[Step in FIG. 6*c*]

The gate insulating film 10 is formed between the LDMOS oxide films 4 by thermal oxidation and the like.

Figure 7A:
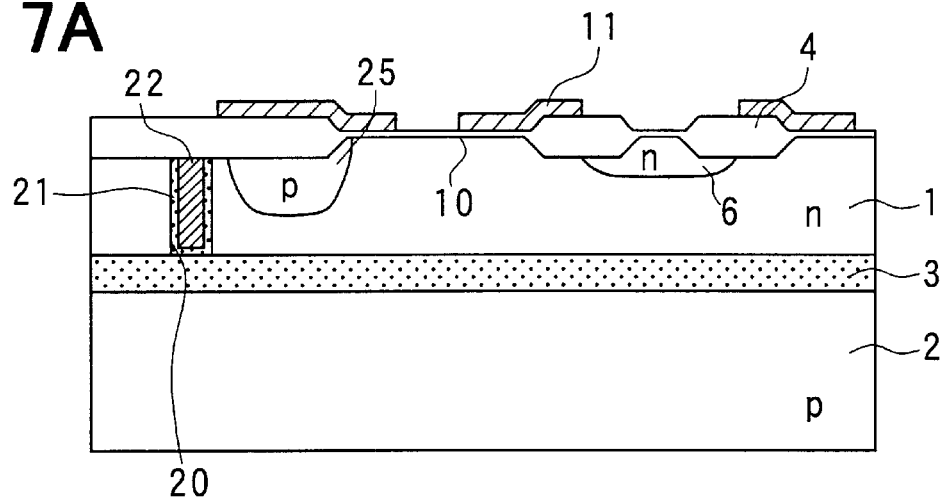
FIG. 7A through 7C are schematic sectional view of the LDMOS shown in FIG. 1 illustrating manufacturing steps of a first embodiment.

[Step in FIG. 7*a*]

A gate electrode 11 is formed by patterning a polysilicon film after depositing the polysilicon film on the gate insulating film 10 and the LOCOS oxide film 4.

Figure 7B:
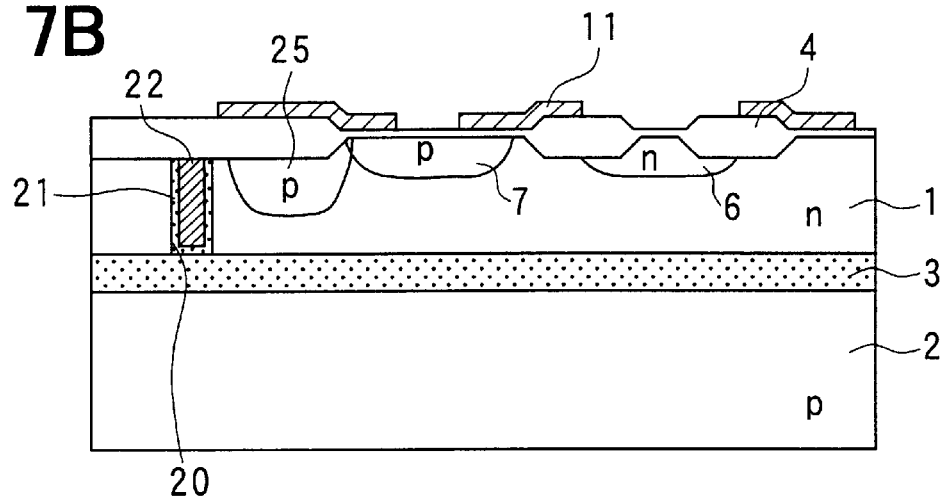

[Step in FIG. 7*b*]

Boron is ion-implanted as a p-type impurity by using the gate electrode as a mask. Then, the p-type base region 7 is formed by thermally diffusing the implanted boron. At this time, it is preferable to set a diffusion depth at approximately 2 μm, a diffusion temperature at 1000° C. or more and a diffusion time at 2 hours or more.

Figure 7C:
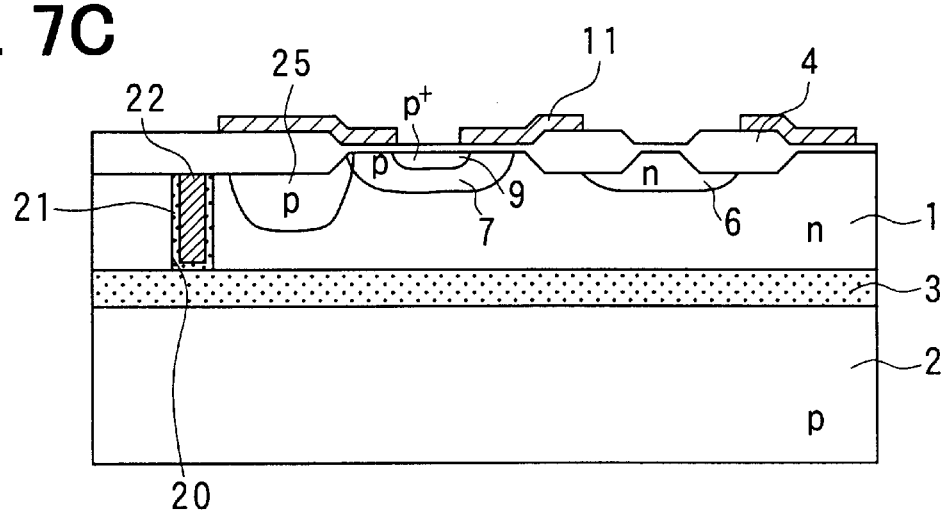

[Step in FIG. 7*c*]

Boron, for example, is ion-implanted into a source forming region as a p-type impurity by using the gate electrode as a mask. Then, the p⁺-type contact region 9 is formed by thermally diffusing the implanted boron. A dosage of boron at this time is more than $2\times10^{15}$ cm⁻² and less than $5\times10^{15}$ cm⁻². A dept of diffusion is more than 0.3 μm and less than 1 μm. A surface concentration of the p⁺-type contact region 9 is approximately $1\times10^{18}$ cm⁻³ or, is preferably $1\times10^{18}$ cm⁻³ or more more. It is also arranged that the implanted p-type impurity does not reach below the gate electrode 11 after the thermal diffusion by setting its diffusion temperature to be lower than the diffusion temperature in forming the p-type base region 7 or setting its diffusion time to be shorter than the diffusion time in forming the p-type base region 7 and by selecting a width of the mask of the ion-implanted part. It is noted that the p⁺-type contact region 9 is prevented from diffusing excessively by the heat in forming the p-type base region 7 because this step for forming the p⁺-type contact region 9is carried out after forming the p-type base region 7.

Figure 8A:
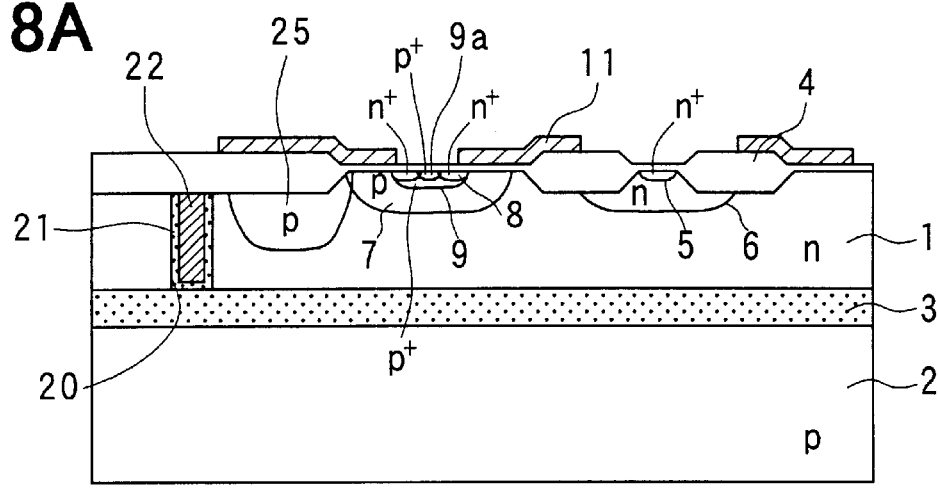
FIG. 8A through 8C are schematic sectional view of the LDMOS shown in FIG. 1 illustrating manufacturing steps of a first embodiment.

[Step in FIG. 8*a*]

A high concentrate p⁺-type region 9*a* is formed in a surface layer part of the p⁺-type contact region 9 by ion-implanting boron as the p-type impurity. The n⁺-type source region 8 and the n⁺-type drain region 5 are formed by ion-implanting arsenic as a n-type impurity to a part of the p⁺-type contact region 9 surrounding the p⁺-type region 9*a* and to the n-type region 6. At this time, the n⁺-type drain region 5 is diffused under the insulating film4 with a self-alignment by using the insulating film 4 as a mask.

Figure 8B:
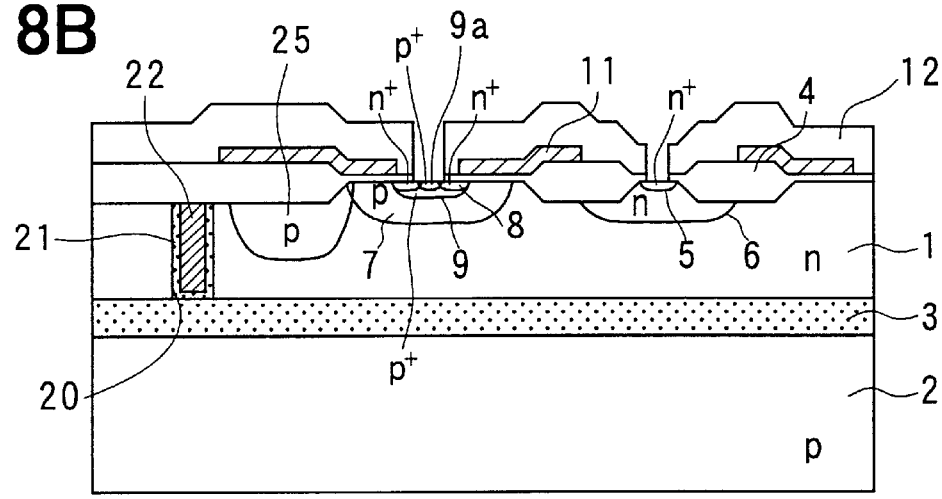

[Step in FIG. 8*b*]

Contact holes each connected with the n⁺-type drain region 5, the p⁺-type contact region 9 and the n⁺-type source region 8 is formed by selectively removing the interlayer insulating film 12 after forming the interlayer insulating film 12 composed of a BPSG film and others on the whole upper surface of the substrate including the gate electrode 11.

Figure 8C:
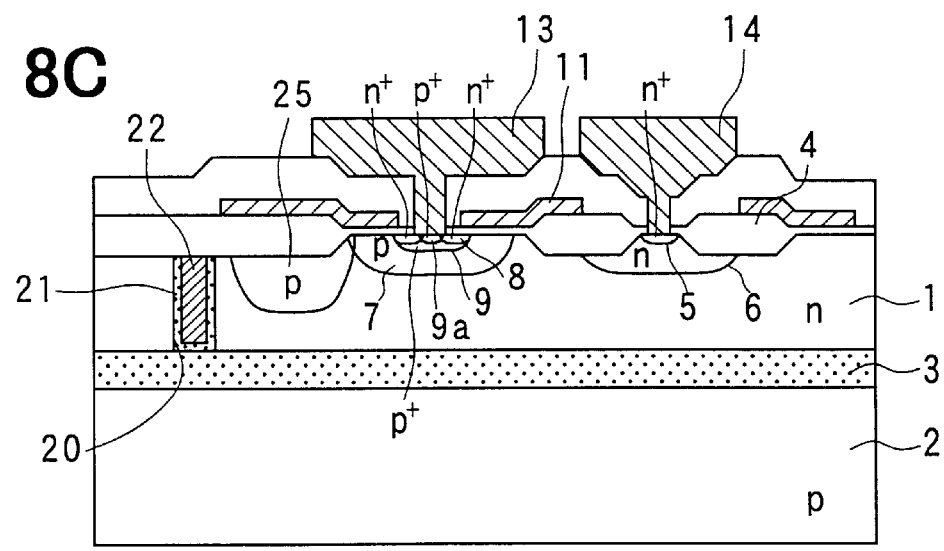

[Step in FIG. 8*c*]

The source electrode 13 electrically connected with the p⁺-type contact region 9 and the n⁺-type source region 8 via the contact hole is formed and the drain electrode 14 electrically connected with the n⁺-type drain region 5 is formed by patterning an Al film after depositing an Al film on the interlayer insulating film 12.

Thus, the LDMOS whose capacity for ESD surge is improved as shown in FIG. 1 is fabricated. It is noted that although the deep base layer shown in FIG. 1 is omitted in FIGS. 5 through 8, the deep base layer may be formed in the step shown in FIG. 5c by dividing a width and a range of ion-implantation into two steps.

It is noted that although the concentration profile of the n-type region 6 is approximately $5 \times 10^{16}$ to $2 \times 10^{17}$ cm$^{-3}$ in the embodiment described above, it is merely an illustration and the current value coming into the negative resistance region may be rised as long as the n-type region 6 is constructed such that at least its concentration is higher than that of the n-type substrate 1 and gradually increases from the n-type substrate 1 to the n⁺-type drain region 5.

Further, although the p⁺-type contact region 9 extends below the n⁺-type source region 8 in the embodiment described above, the same effect with the above embodiment may be obtained by forming a p⁺-type region beside the p⁺-type contact region 9 and by disposing it so as to contact with the under part of the n⁺-type source region 8.

Figure 9:
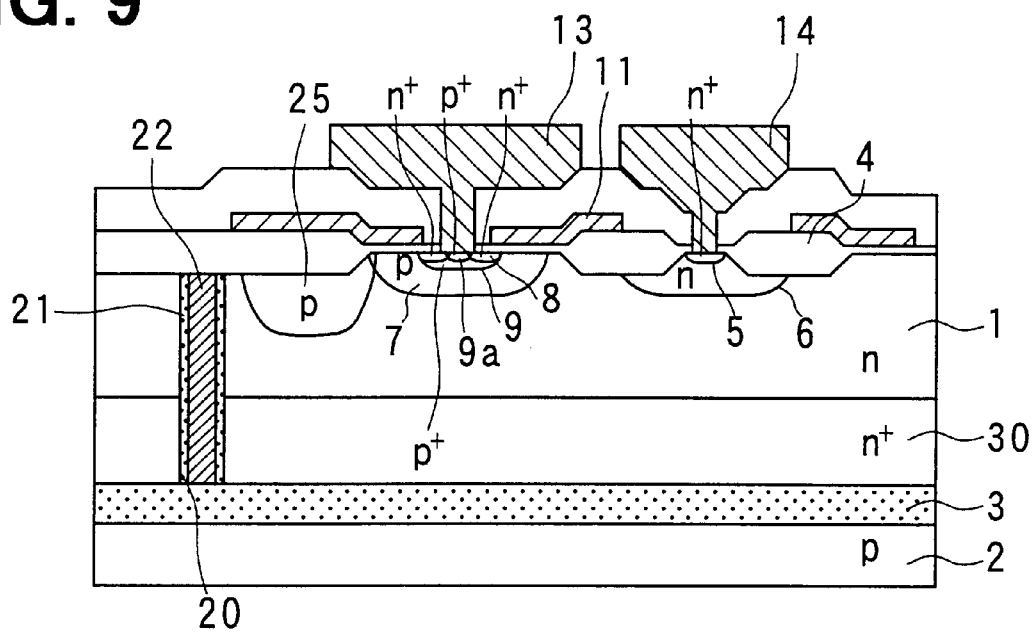
FIG. 9 is a schematic sectional view of a LDMOS in another embodiment.
Figure 10:
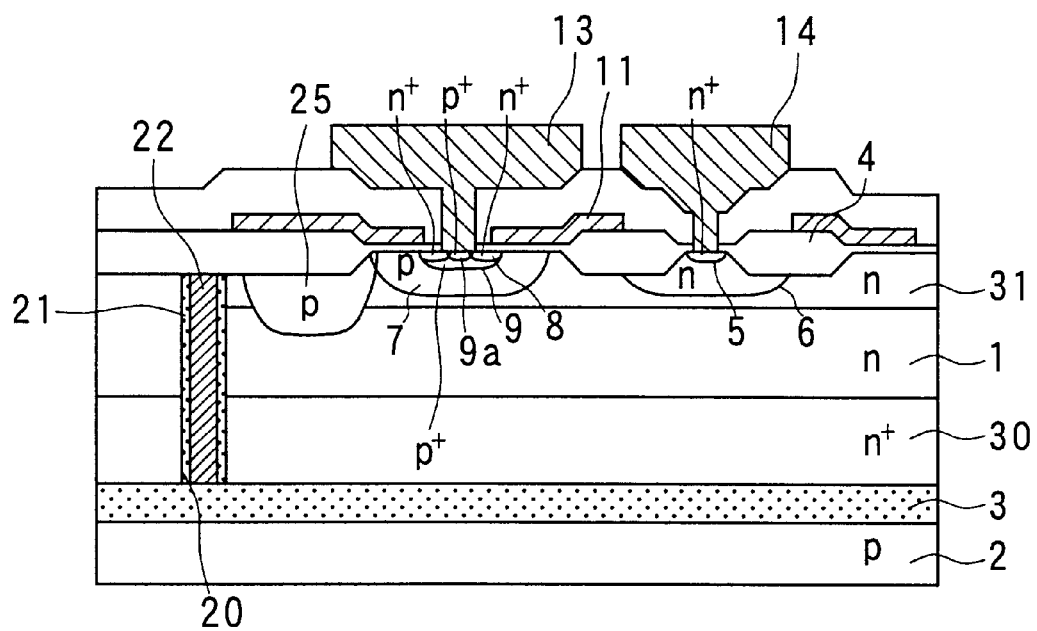
FIG. 10 is a sectional structure of a LDMOS in another embodiment.

Although the SOI substrate in which the oxide film and the n-type epi-layer are formed on the p-type substrate is applied to one embodiment for this invention, a buried n⁺-type layer 30 may be formed at an interface portion the n-type substrate 1 with the oxide film as shown in FIG. 9. An n-type drift layer 31 whose concentration is higher than that of the n-type epi-layer 1 may be also formed on an upper portion of the n-type epi-layer 1 as shown in FIG. 10.

Figure 11:
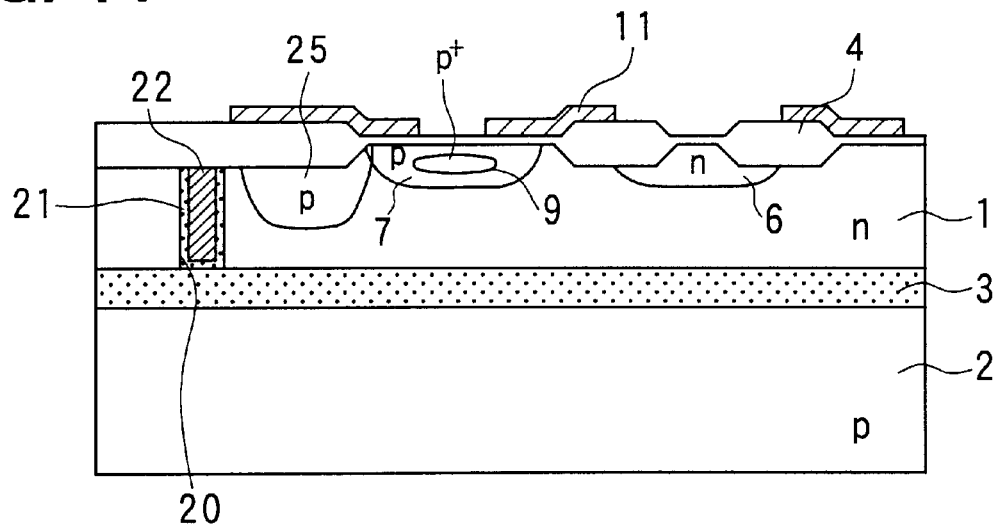
FIG. 11 is a sectional structure of a LDMOS in another embodiment.

It is also possible to carry out high-acceleration ion-implantation when the p⁺-type contact region 9 is formed as shown in FIG. 7c and to bring a center range at a part about 1 μm from the surface of the n-type epitaxial layer 1 as shown in FIG. 11. In this way, the concentration of the channel part can be suppressed low even if the concentration of the p⁺-type contact region 9 is increased. It is noted that it is preferable to carry out the ion-implantation from a vertical direction in forming the p⁺-type contact region 9.

Figure 12:
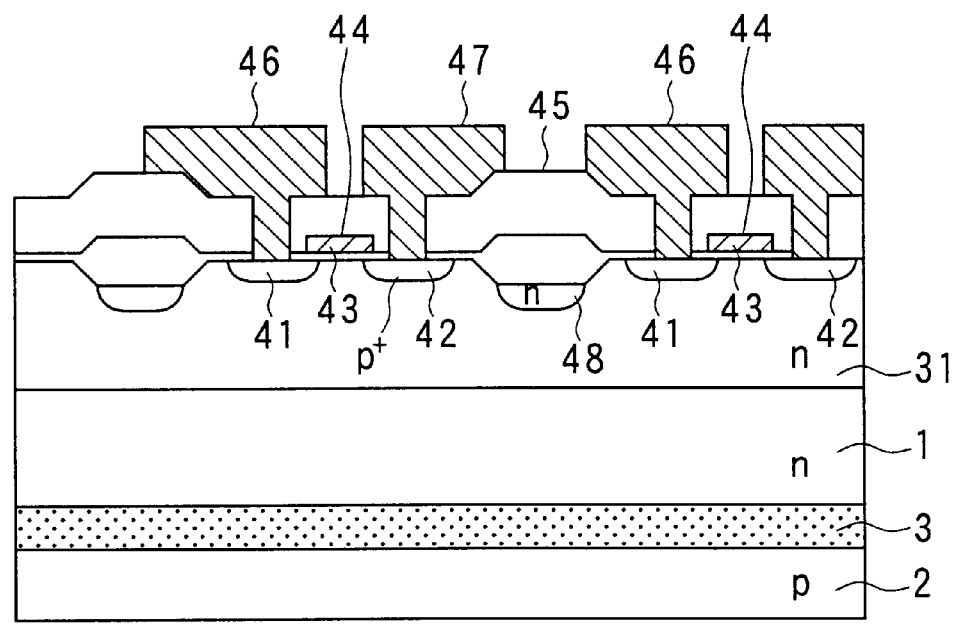
FIG. 12 is a sectional view of a MOS transistor which is formed together with the LDMOS of the another embodiment.

Further, the LDMOS illustrated in the embodiments described above may be formed together with a P-channel MOS transistor as shown in FIG. 12 in which a p⁺-type source region 41 and a p⁺-type drain region 42 are formed on a surface layer part of an n-type layer 31 which is formed in an upper portion of the n-type epi-layer 1, a gate electrode 44 is formed on a channel region between the p⁺-type source region 41 and the p⁺-type drain region 42 through a gate oxide film 43 and a source electrode 46 and a drain electrode 47 are formed through an interlayer insulating film 45. In this case, it is possible to share the step for forming the n-type region 6 provided in the LDMOS and the step for forming n-type region 48 disposed between neighboring cells, i.e., between a source of one P-channel MOS transistor and a drain of the other P-channel MOS transistor adjacent to the one P-channel MOS transistor in concrete. It allows the manufacturing steps to be simplified.

It is noted that although the n-channel type LDMOS has been explained above, the present invention is also applicable to a p-channel type LDMOS in which the conductive type is inverted.

What is claimed is:

1. A semiconductor device comprising:
    a substrate having a semiconductor layer of a first conductivity type, wherein the semiconductor layer has an impurity concentration;
    a base region of a second conductivity type formed on the semiconductor layer;
    a source region formed on the base region, wherein the source region is of the first conductivity type;
    a drain region located on the semiconductor layer and separated from the base region, wherein the drain region is of the first conductivity type;
    a gate insulating film formed on a channel region of the base region between the source region and the base region;
    a gate electrode formed on the gate insulating film;
    a source electrode connected to the source region;
    a drain electrode connected to the drain region; and
    a varying impurity region located on the semiconductor layer between the drain region and the base region, wherein the varying impurity region is of the first conductivity type and has an impurity concentration, and the impurity concentration of the varying impurity region is higher than the impurity concentration of the semiconductor layer and increases at locations closer to the drain region, and the impurity concentration of a surface portion of the varying impurity region near the drain region is approximately between $5 \times 10^{16}$ and $2 \times 10^{17}$ cm$^{-3}$.

2. A semiconductor device according to claim 1, wherein a surface portion of the semiconductor layer lies between the varying impurity region and the base region.

3. A semiconductor device according to claim 2, wherein the impurity concentration of the surface portion is approximately between $1 \times 10^{15}$ and $1 \times 10^{16}$ cm$^{-3}$.

4. A semiconductor device according to claim 1 further comprising a contact region of the second conductivity type, wherein the contact region contacts a lower part of the source region and has an impurity concentration higher than that of the base region.

5. A semiconductor device according to claim 4, wherein the contact region is spaced from the channel region.

6. A semiconductor device according to claim 1 further comprising a contact region located adjacent to the source region at a surface portion of the base region, wherein the contact region and the source region contact the source electrode, the contact region has an impurity concentration higher than that of the base region, and the contact region extends under the source region.

7. A semiconductor device according to claim 6, wherein the contact region contacts the source electrode at a contact area of the source electrode, wherein the source is located between the channel region and the contact area.

8. A semiconductor device comprising:
    a substrate having a semiconductor layer of a first conductivity type, wherein the semiconductor layer has an impurity concentration;
    a base region of a second conductivity type formed on the semiconductor layer;
    a source region formed on the base region, wherein the source region is of the first conductivity type;
    a drain region located on the semiconductor layer and separated from the base region, wherein the drain region is of the first conductivity type;
    a gate insulating film formed on a channel region of the base region between the source region and the base region;
    a gate electrode formed on the gate insulating film;
    a source electrode connected to the source region;
    a drain electrode connected to the drain region; and a varying impurity region located on the semiconductor layer to encompass the drain region, wherein the varying impurity region is of the first conductivity type and has an impurity concentration, and the impurity concentration of the varying impurity region is higher than the impurity concentration of the semiconductor layer and increases at locations closer to the drain region, and the impurity concentration of a surface portion of the varying impurity region near the drain region is approximately between $5 \times 10^{16}$ and $2 \times 10^{17}$ cm$^{-3}$.

9. A semiconductor device according to claim 8 further comprising a contact region of the second conductivity type, wherein ihe contact region contacts a lower part of the source region and has an impurity concentration higher than that of the base region.

10. A semiconductor device according to claim 9, wherein the contact region is spaced from the channel region.

11. A semiconductor device according to claim 8 further comprising a contact region located adjacent to the source region at a surface portion of the base region, wherein the contact region and the source region contact the source electrode, the contact region has an impurity concentration higher than that of the base region, and the contact region extends under the source region.

12. A semiconductor device according to claim 11, wherein the contact region contacts the source electrode at a contact area of the source electrode, wherein the source is located between the channel region and the contact area.

13. A semiconductor device comprising:

a semiconductor layer of a first conductivity type;

a lateral MOS transistor formed on the layer, the transistor comprising:

a base region of a second conductivity type formed at a surface of the layer;

a source region formed within the base region, wherein the source region is of the first conductivity type;

a drain region formed at the surface of the semiconductor layer, wherein the drain region is of the first conductivity type; and wherein the drain region is separated from the base region by a surface portion of the semiconductor layer; and a gate insulating film formed on a channel region of the base region between the source region;

a source electrode contacting the source region;

a drain electrode contacting the drain region;

a varying impurity region located at the surface of the semiconductor layer to encompass the drain region, wherein the varying impurity region is of the first conductivity type and has an impurity concentration, and the impurity concentration of the varying impurity region is higher than the impurity concentration of the semiconductor layer and increases at locations closer to the drain region, and the impurity concentration of a surface portion of the varying impurity region near the drain region is approximately between $5 \times 10^{16}$ and $2 \times 10^{17}$ cm$^{-3}$; and a contact region located within the base region and under the source region, wherein the contact region is of the second conductivity type and has an impurity concentration that is higher than that of the base region.

14. The semiconductor device according to claim 13, wherein the impurity concentration of the surface portion is is approximately between between $1 \times 10^{15}$ and $1 \times 10^{16}$ cm$^{-3}$.

15. The semiconductor device according to claim 13, wherein the contact region is spaced from the channel region and contacts the source electrode and the source region.

16. The semiconductor device of claim 13, wherein the contact region is more shallow than the base region.

* * * * *

UNITED STATES PATENT AND TRADEMARK OFFICE
CERTIFICATE OF CORRECTION

PATENT NO. : 6,465,839 B2
DATED : October 15, 2002
INVENTOR(S) : Shigeki Takahashi and Hiroaki Himi It is certified that error appears in the above-identified patent and that said Letters Patent is hereby corrected as shown below:

<u>Title page,</u>
Item [75], Inventors, should read -- Shigeki Takahashi, Okazaki (JP);
                                      Hiroaki Himi, Nagoya (JP) --
Item [30], Foreign Application Priority Data, should read
-- Apr. 7, 2000  (JP) ................................ 2000-106991
   Dec. 27, 2000 (JP) ................................ 2000-398749 --

Signed and Sealed this

Third Day of May, 2005

JON W. DUDAS
*Director of the United States Patent and Trademark Office*